United States Patent
Nishizawa et al.

(10) Patent No.: US 10,224,294 B2
(45) Date of Patent: Mar. 5, 2019

(54) SEMICONDUCTOR DEVICE

(71) Applicant: Mitsubishi Electric Corporation, Tokyo (JP)

(72) Inventors: Koichiro Nishizawa, Tokyo (JP); Takayuki Hisaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/735,858

(22) PCT Filed: Mar. 2, 2016

(86) PCT No.: PCT/JP2016/056394
§ 371 (c)(1),
(2) Date: Dec. 12, 2017

(87) PCT Pub. No.: WO2017/029822
PCT Pub. Date: Feb. 23, 2017

(65) Prior Publication Data
US 2018/0138132 A1 May 17, 2018

(30) Foreign Application Priority Data
Aug. 18, 2015 (JP) .................................. 2015-161093

(51) Int. Cl.
*H01L 23/00* (2006.01)
*H01L 23/02* (2006.01)
(Continued)

(52) U.S. Cl.
CPC ........ *H01L 23/562* (2013.01); *H01L 21/4817* (2013.01); *H01L 21/76898* (2013.01);
(Continued)

(58) Field of Classification Search
CPC ......... H01L 24/13; H01L 24/14; H01L 24/16; H01L 24/17
See application file for complete search history.

(56) References Cited

U.S. PATENT DOCUMENTS

| 4,664,309 A | * | 5/1987 | Allen | ....................... B23K 3/06 228/175 |
| 5,767,580 A | * | 6/1998 | Rostoker | ........... H01L 23/49811 257/737 |

(Continued)

FOREIGN PATENT DOCUMENTS

| JP | 2005-057136 A | 3/2005 |
| JP | 2009-088196 A | 4/2009 |

(Continued)

OTHER PUBLICATIONS

An Office Action; "Notification of Reasons for Refusal" issued by the Japanese Patent Office dated Mar. 27, 2018, which corresponds to Japanese Patent Application No. 2017-535247 and is related to U.S. Appl. No. 15/735,858; with English translation.

(Continued)

*Primary Examiner* — Earl N Taylor
(74) *Attorney, Agent, or Firm* — Studebaker & Brackett PC

(57) ABSTRACT

Airtightness of a hollow portion is maintained, and yield and durability are improved. A semiconductor device 1 includes a device substrate 2, a semiconductor circuit 3, a sealing frame 7, a cap substrate 8, via portions 10, electrodes 11, 12 and 13, and a bump portion 14 or the like. A hollow portion 9 in which the semiconductor circuit 3 is housed in an airtight state is provided between the device substrate 2 and the cap substrate 8. The bump portion 14 connects all the via portions 10 and the cap substrate 8. Thus, the via portions 10 can be reinforced using the bump portion 14A.

19 Claims, 19 Drawing Sheets

(51) Int. Cl.
  *H01L 23/04* (2006.01)
  *H01L 23/10* (2006.01)
  *H01L 23/12* (2006.01)
  *H01L 23/14* (2006.01)
  *H01L 29/812* (2006.01)
  *H01L 21/48* (2006.01)
  *H01L 21/768* (2006.01)
  *H01L 23/48* (2006.01)
  *H01L 23/544* (2006.01)
  *H01L 23/552* (2006.01)
  *H01L 25/065* (2006.01)

(52) U.S. Cl.
  CPC .............. *H01L 23/02* (2013.01); *H01L 23/04* (2013.01); *H01L 23/041* (2013.01); *H01L 23/10* (2013.01); *H01L 23/12* (2013.01); *H01L 23/14* (2013.01); *H01L 23/481* (2013.01); *H01L 23/544* (2013.01); *H01L 23/552* (2013.01); *H01L 24/13* (2013.01); *H01L 24/16* (2013.01); *H01L 29/812* (2013.01); *H01L 25/0657* (2013.01); *H01L 2223/5442* (2013.01); *H01L 2223/54426* (2013.01); *H01L 2224/13139* (2013.01); *H01L 2224/13144* (2013.01); *H01L 2224/13147* (2013.01); *H01L 2224/13164* (2013.01); *H01L 2224/13169* (2013.01); *H01L 2224/16227* (2013.01); *H01L 2224/94* (2013.01); *H01L 2224/97* (2013.01); *H01L 2225/06517* (2013.01); *H01L 2225/06537* (2013.01); *H01L 2225/06541* (2013.01); *H01L 2225/06575* (2013.01); *H01L 2924/13051* (2013.01); *H01L 2924/13064* (2013.01); *H01L 2924/3025* (2013.01); *H01L 2924/35121* (2013.01)

(56) References Cited

U.S. PATENT DOCUMENTS

| | | | | |
|---|---|---|---|---|
| 5,959,355 A * | 9/1999 | Petit | ................. | H01L 23/49811 257/737 |
| 6,638,638 B2 | 10/2003 | Kim | ................. | B23K 1/0008 228/246 |
| 6,812,558 B2 * | 11/2004 | Chen | ................. | B81C 1/00301 257/688 |
| 6,846,725 B2 * | 1/2005 | Nagarajan | ................. | B81B 7/007 438/456 |
| 6,953,990 B2 * | 10/2005 | Gallup | ................. | H01S 5/02288 257/678 |
| 7,230,512 B1 * | 6/2007 | Carpenter | ................. | H03H 3/08 333/133 |
| 7,259,080 B2 * | 8/2007 | Quenzer | ................. | B81C 1/00611 257/E21.22 |
| 7,416,961 B2 * | 8/2008 | Quenzer | ................. | B81C 99/0085 257/E21.122 |
| 7,473,580 B2 * | 1/2009 | Farooq | ................. | B23K 3/0623 257/778 |
| 7,557,452 B1 * | 7/2009 | Williams | ................. | H01L 23/49811 257/697 |
| 8,129,838 B2 * | 3/2012 | Reinert | ................. | B81B 7/007 257/685 |
| 8,291,586 B2 * | 10/2012 | Marion | ................. | H01L 24/81 29/843 |
| 9,013,011 B1 * | 4/2015 | Kuo | ................. | H01L 27/04 257/415 |
| 9,240,373 B2 * | 1/2016 | Ebefors | ................. | H01L 23/147 |
| 9,318,400 B2 * | 4/2016 | O'Brien | ................. | H01L 23/12 |
| 9,362,139 B2 * | 6/2016 | Ebefors | ................. | B81B 7/007 |
| 9,437,551 B2 * | 9/2016 | Cheng | ................. | H01L 23/544 |
| 9,514,985 B2 * | 12/2016 | Ebefors | ................. | H01L 21/76898 |
| 9,607,915 B2 * | 3/2017 | Erlesand | ................. | H01L 23/15 |
| 9,620,390 B2 * | 4/2017 | Ebefors | ................. | B81B 7/007 |
| 9,718,674 B2 * | 8/2017 | Kalvesten | ................. | H01L 21/50 |
| 2004/0016995 A1 * | 1/2004 | Kuo | ................. | B81C 1/0023 257/678 |
| 2004/0077121 A1 * | 4/2004 | Maeda | ................. | H01L 27/14618 438/75 |
| 2004/0180517 A1 * | 9/2004 | Quenzer | ................. | B81C 99/0085 438/479 |
| 2004/0188821 A1 * | 9/2004 | Chen | ................. | B81C 1/00301 257/688 |
| 2004/0188836 A1 * | 9/2004 | Key | ................. | H01L 23/49816 257/738 |
| 2004/0259325 A1 * | 12/2004 | Gan | ................. | B81B 7/007 438/456 |
| 2005/0104204 A1 * | 5/2005 | Kawakubo | ................. | B81C 1/00301 257/724 |
| 2005/0104222 A1 * | 5/2005 | Jeong | ................. | H01L 23/16 257/778 |
| 2006/0022325 A1 * | 2/2006 | Hwang | ................. | B81B 7/007 257/690 |
| 2006/0286798 A1 * | 12/2006 | Lee | ................. | B81C 1/00301 438/672 |
| 2007/0108634 A1 * | 5/2007 | Higashi | ................. | H01L 23/04 257/787 |
| 2007/0200146 A1 * | 8/2007 | Onishi | ................. | H03H 9/0523 257/202 |
| 2008/0081398 A1 * | 4/2008 | Lee | ................. | B81C 1/00301 438/109 |
| 2008/0191956 A1 * | 8/2008 | Watanabe | ................. | H01L 25/162 343/841 |
| 2008/0299706 A1 * | 12/2008 | Yuan | ................. | H01L 23/10 438/113 |
| 2010/0252898 A1 * | 10/2010 | Tanaka | ................. | B81B 7/0041 257/415 |
| 2011/0115092 A1 * | 5/2011 | Tago | ................. | H01L 23/552 257/762 |
| 2012/0025366 A1 * | 2/2012 | Kanaya | ................. | H01L 21/50 257/693 |
| 2012/0101540 A1 * | 4/2012 | O'Brien | ................. | A61B 5/0031 607/9 |
| 2012/0142144 A1 * | 6/2012 | Taheri | ................. | B81B 7/007 438/107 |
| 2012/0223410 A1 * | 9/2012 | Fujii | ................. | H01L 21/76898 257/507 |
| 2012/0267773 A1 * | 10/2012 | Ebefors | ................. | B81B 7/007 257/692 |
| 2012/0299178 A1 * | 11/2012 | Kanaya | ................. | H01L 23/481 257/737 |
| 2013/0209672 A1 * | 8/2013 | Reinmuth | ................. | H05K 3/4061 427/97.8 |
| 2015/0076677 A1 * | 3/2015 | Ebefors | ................. | H01L 23/49811 257/676 |
| 2015/0115440 A1 * | 4/2015 | Higuchi | ................. | H01L 24/05 257/737 |
| 2015/0175406 A1 * | 6/2015 | Lin | ................. | B81B 7/007 257/415 |
| 2015/0279756 A1 * | 10/2015 | Erlesand | ................. | H01L 23/49827 257/415 |
| 2017/0001858 A1 * | 1/2017 | Adams | ................. | B81B 7/007 |
| 2018/0138132 A1 * | 5/2018 | Nishizawa | ................. | H01L 23/02 |

FOREIGN PATENT DOCUMENTS

| | | | | |
|---|---|---|---|---|
| JP | 2012-033615 A | | 2/2012 | |
| JP | 2012-244059 A | | 12/2012 | |
| JP | WO 2017029822 A1 * | | 2/2017 | ............ H01L 23/02 |
| WO | 2007/049376 A1 | | 5/2007 | |
| WO | 2010/013728 A1 | | 2/2010 | |

OTHER PUBLICATIONS

PCT/IB/373, International Preliminary Report on Patentability, dated Mar. 1, 2018, which issued in parent International application PCT/JP2016/056394, 2 pp.

PCT/ISA/237, Written Opinion, dated May 24, 2016, which issued in parent International application PCT/JP2016/056394, 6 pp.

(56) References Cited

OTHER PUBLICATIONS

International Search Report issued in PCT/JP2016/056394; dated May 24, 2016.

\* cited by examiner

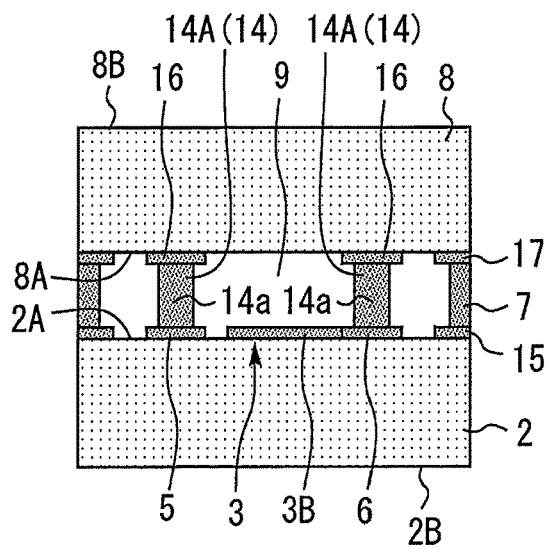
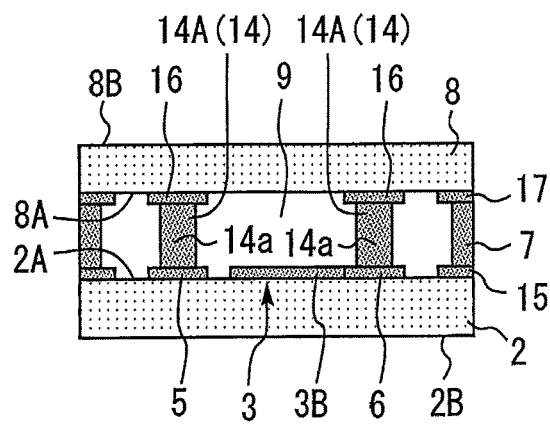
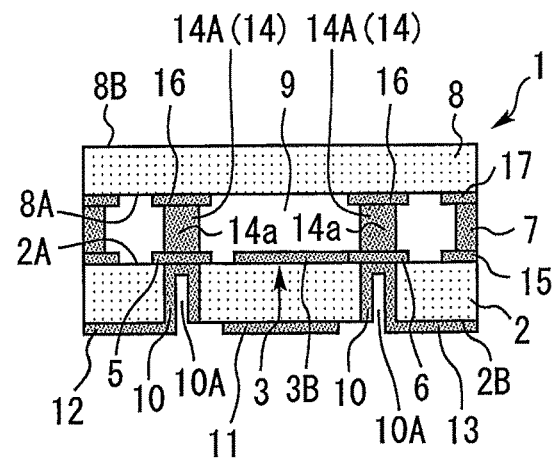

SEMICONDUCTOR DEVICE

FIELD

The present invention relates to a semiconductor device, and in particular to a semiconductor device including a hollow part.

BACKGROUND

Generally, semiconductor chips sometimes malfunction due to corrosion of electrodes caused by water content in the atmosphere, and therefore semiconductor chips may be packaged so as to have an airtight structure. Semiconductor chips performing high frequency operation are required to have packages provided with an electromagnetic shielding function to avoid problems such as unstable operation under influences of external radio waves and unnecessary radiation from the semiconductors themselves. Package materials for such chips are generally configured by attaching a metal cap to a base member of CuW or the like, which is however expensive, causing a cost increase. In response to this, in recent years, methods for reducing packaging costs are being actively developed by packaging (CSP structuring) semiconductor chips on chip scales. Structures described in PTLs 1, 2 and 3 are known as typical structures of packaged hollow devices.

PTL 1 describes a case where a HEMT structure which is one of basic transistors of high frequency devices is packaged. According to PTL 1 as shown in FIG. 4 to FIG. 6, a sealing frame is provided on a chip peripheral portion of a device substrate, further a cap is pasted to the sealing frame, and a semiconductor circuit is sealed in a hollow part and packaged. PTL 1 proposes a structure for implementing an electromagnetic shield function by providing the cap and the sealing frame with conductivity. The electromagnetic shield is a function used for a high frequency semiconductor and is intended to suppress influences of radiation of electromagnetic wave generated from the semiconductor circuit on peripheral devices and influences of electromagnetic wave of the peripheral devices on the semiconductor circuit.

According to PTLs 2 and 3, a hollow part is provided between the device substrate and the cap without using any sealing frame but by forming a dent in the cap. According to PTL 2, the electromagnetic shield function is implemented by forming a conductive film in the dent of the cap. According to PTL 3, a heat dissipation electrode is formed on an opposite side of the cap.

CITATION LIST

Parent Literature

[PTL 1] JP 2005-57136 A
[PTL 2] JP 2012-33615 A
[PTL 3] JP 2012-244059 A
[PTL 4] WO 2007/049376
[PTL 5] WO 2010/013728

SUMMARY

Technical Problem

However, the aforementioned prior arts can hardly secure air tightness in packages. First, the prior arts in PTLs 1 to 3 have a common problem that airtightness breakdown is likely to occur from via portions. More specifically, a product (deposited substance) generated at the time of etching exists on a side wall of a via hole formed in a substrate. Therefore, even when a conductive metal is formed in close contact with a side wall, close adhesion is likely to deteriorate. Moreover, there is a difference in thermal expansion coefficient and linear thermal expansion coefficient between the conductive metal in the via hole and the substrate. For this reason, if a heat history is added to the semiconductor device during a wafer process or chip operation, the conductive metal in the via hole that originally has low close adhesion may be peeled or stress may be added to an electrode pad bonded to the conductive metal, causing the electrode pad to be peeled, and as a result, there is a problem that airtightness breakdown of the hollow part may occur. Note that examples of the above-described heat history include temperature change about 50 to 300· C caused by transistor operation, solder die bonding mounting, baking, chemical treatment, or the like.

According to the prior art described in PTL 3, a bump structure formed of the conductive metal and a joint at which the cap itself is bonded to the device substrate coexist between the device substrate and the cap substrate. There is a difference in a linear thermal expansion coefficient between these regions. For this reason, if the heat history is added, there is a problem that stress is added to the joint between the device substrate and the cap substrate, making it more likely to cause cracking in the cap substrate and the device substrate or the like and result in airtightness breakdown.

The present invention has been implemented to solve the above-described problems and it is an object of the present invention to provide a semiconductor device capable of stably keeping air tightness in a hollow part and improving yield and durability.

Solution to Problem

A semiconductor device according to the present invention includes: a device substrate having a front surface and a back surface; a semiconductor circuit provided on the front surface of the device substrate; a sealing frame bonded to the front surface of the device substrate and surrounding the semiconductor circuit; a cap substrate including a substrate having a front surface and a back surface, wherein the back surface is bonded to the whole perimeter of the sealing frame while covering the semiconductor circuit to form a hollow part provided between the device substrate and the cap substrate and housing the semiconductor circuit in an airtight state; a plurality of via portions formed of a conductive material for connecting the semiconductor circuit to outside parts, and penetrating the device substrate, and connected to the semiconductor circuit; and a plurality of bump portions respectively provided at all positions of the via portions in the hollow part and connecting the via portions to the cap substrate.

Advantageous Effects of Invention

In the present invention, the bump portions are formed on all the via portions and the bump portions can bond the via portions and the cap substrate. Thus, the bump portions supported by the cap substrate can reinforce the via portions and suppress deformation, peeling or the like of the via portions. This makes it possible to increase bonding reliability between the device substrate and the cap substrate, and stably keep air tightness of the hollow part. Therefore, it is possible to improve yield and durability of the semiconductor device.

BRIEF DESCRIPTION OF THE DRAWINGS

FIG. 6 illustrates a step of bonding together the device substrate and the cap substrate.

FIG. 7 illustrates a step of thinning the device substrate and the cap substrate after bonding.

FIG. 8 illustrates a step of forming the via portions and the electrodes on the back surface side of the device substrate.

DESCRIPTION OF EMBODIMENTS

Figure 1:
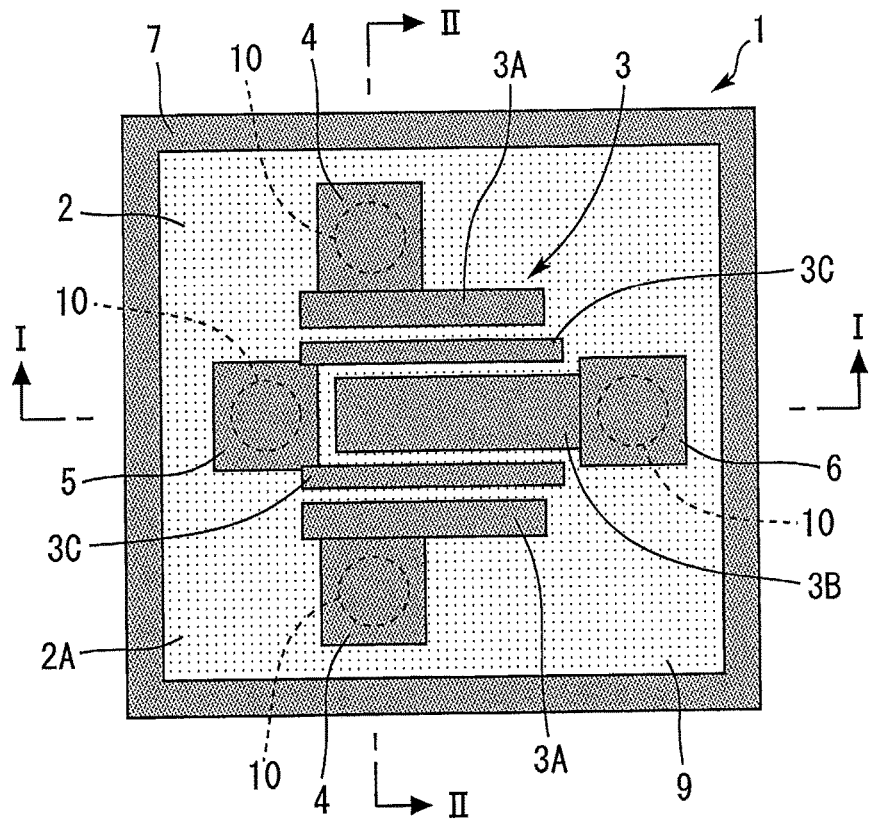
FIG. 1 is a plan view illustrating a semiconductor device according to the first embodiment of the present invention, part of which is omitted.

Hereinafter, embodiments of the present invention will be described with reference to the accompanying drawings. Note that it is assumed that common elements among drawings used in the present specification are assigned the same reference numerals and duplicate description is omitted. The present invention is not limited to the following embodiments, but can be modified in various ways without departing from the spirit and scope of the present invention. The present invention includes all possible combinations of components shown in the following embodiments. Furthermore, in the present specification, a "connection" between structures having electrical functions is assumed to mean electrical or mechanical connections.

First Embodiment

Figure 2:
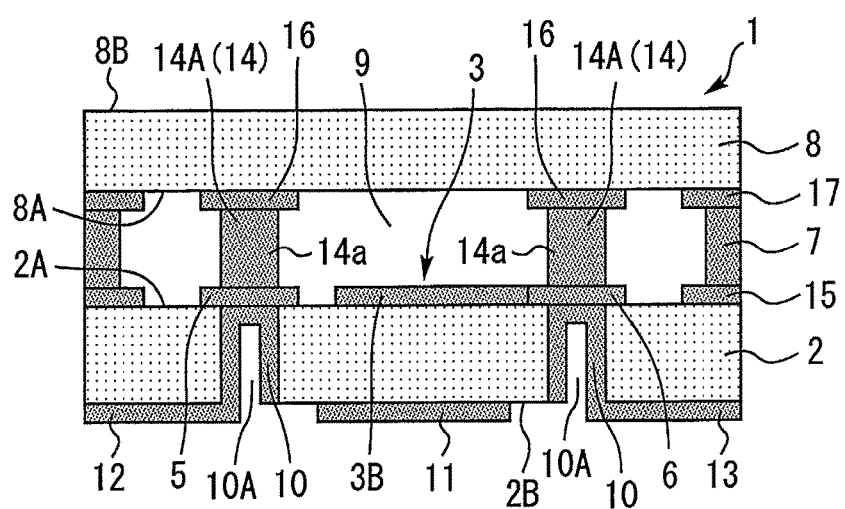
FIG. 2 is a cross-sectional view along an arrowed line I-I of the semiconductor device shown in FIG. 1.
Figure 3:
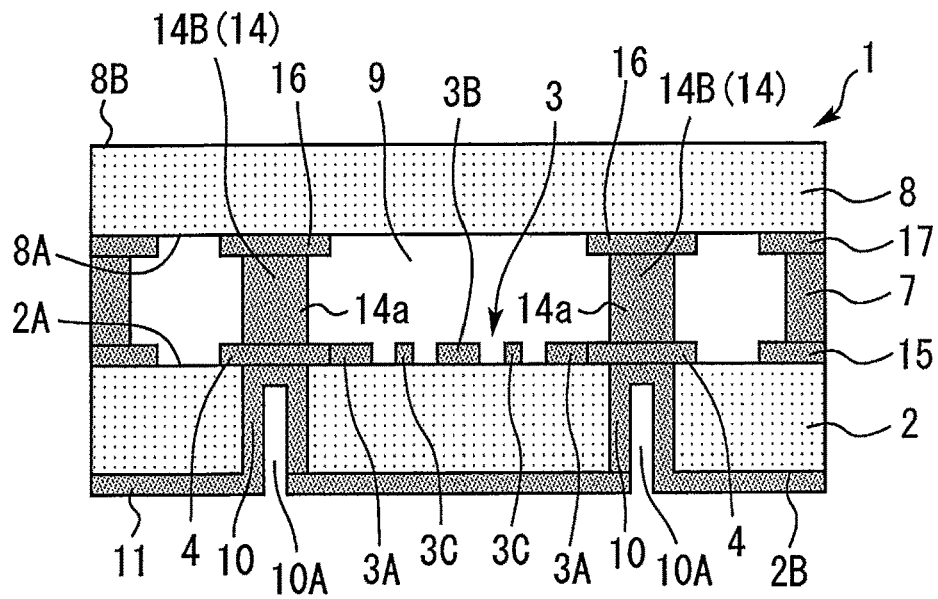
FIG. 3 is a cross-sectional view along an arrowed line II-II of the semiconductor device.

First, a first embodiment of the present invention will be described with reference to FIG. 1 to FIG. 12. FIG. 1 is a plan view illustrating a semiconductor device according to the first embodiment of the present invention, part of which is omitted. Note that in FIG. 1, illustrations of a cap substrate 8 or the like are omitted. FIG. 2 is a cross-sectional view along an arrowed line I-I of the semiconductor device shown in FIG. 1 and FIG. 3 is a cross-sectional view along an arrowed line II-II of the semiconductor device. As shown in these drawings, the semiconductor device 1 according to the present embodiment is provided with a device substrate 2, a semiconductor circuit 3, electrode pads 4, 5 and 6, a sealing frame 7, a cap substrate 8, a hollow part 9, a via portion 10, a bump portion 14, and bonding pads 15, 16 and 17. Note that in the present specification, the device substrate 2 and the cap substrate 8 may be collectively denoted as "substrates 2 and 8." The ground electrode pad 4, the input electrode pad 5 and the output electrode pad 6 may be collectively denoted as "electrode pads 4, 5 and 6" and the ground electrode 11, the input electrode 12 and the output electrode 13 may be collectively denoted as "electrodes 11, 12 and 13."

The device substrate 2 is, for example, a single crystal GaAs substrate or silicon substrate formed into a tabular shape, and includes a front surface 2A and a back surface 2B. The semiconductor circuit 3 is made up of, for example, a HEMT transistor and is provided on a front surface 2A (semiconductor operation surface) side of the device substrate 2. Note that the present invention is not limited to the HEMT transistor, but is also applicable to, for example, other field-effect transistors, bipolar transistor such as HBT and a semiconductor circuit made up of an integrated circuit or the like. In the present invention, of both sides of the device substrate 2, an opposite surface facing the cap substrate 8 is denoted as the front surface 2A and an outside surface facing the outside of the semiconductor device 1 is denoted as the back surface 2B.

The semiconductor circuit 3 is provided with source electrodes 3A, a drain electrode 3B and gate electrodes 3C fixed to the front surface 2A of the device substrate 2. The drain electrode 3B is disposed, for example, at a center of the device substrate 2 and the source electrodes 3A are disposed on both sides of the drain electrode 3B. The gate electrodes 3C are disposed between the drain electrode 3B and each source electrode 3A on both sides of the drain electrode 3B.

Furthermore, the ground electrode pad 4, the input electrode pad 5 and the output electrode pad 6 are fixed to the front surface 2A of the device substrate 2. For example, two ground electrode pads 4 are disposed, one of which is connected to each source electrode 3A. The two gate electrodes 3C are connected to the input electrode pad 5. The output electrode pad 6 is connected to the drain electrode 3B. The aforementioned electrodes 3A, 3B and 3C, and the electrode pads 4, 5 and 6 are formed of a metal film such as Au.

With the semiconductor circuit 3 configured in this way, when an input signal is inputted from the input electrode pad 5 to each gate electrode 3C, the input signal is amplified by a transistor and then outputted from the drain electrode 3B to the output electrode pad 6. Note that the aforementioned configuration of the semiconductor circuit 3 is an example and does not limit the present invention. The ground electrode pad 4, the input electrode pad 5 and the output electrode pad 6 constitute parts of bump portions 14 formed at positions of the electrode pads 4, 5 and 6. According to this configuration, the bump portion 14 is directly connected to the via portion 10. On the other hand, according to the present invention, the ground electrode pad 4, the input electrode pad 5 and the output electrode pad 6 may also be considered as a structure different from the bump portion 14. In this case, the bump portion 14 is indirectly connected to the via portion 10 via any one of the electrode pads 4, 5 and 6. The present invention has a feature that the bump portion 14 is connected to the via portion 10 and includes both a configuration in which the bump portion 14 is connected to the via portion 10 via the electrode pads 4 to 6 and a configuration in which the bump portion 14 is directly connected to the via portion 10.

The sealing frame 7 is made of a conductive material containing Au, Ag, Cu, Pt, Pd or an alloy of such conductive materials and is formed into a rectangular frame shape. The sealing frame 7 is bonded to the front surface 2A of the device substrate 2 at a position surrounding the whole perimeter of the semiconductor circuit 3 and vertically protrudes from the front surface 2A. The cap substrate 8 is formed as a tabular chip facing the device substrate 2 and bonded to the whole perimeter of the sealing frame 7 while covering the semiconductor circuit 3 or the like. In this way, a hollow part 9 is formed at a position inside the sealing frame 7 between the device substrate 2 and the cap substrate 8. The semiconductor circuit 3 and the bump portions 14 including the electrode pads 4, 5 and 6 are housed in the hollow part 9 in an airtight state. Note that according to the present specification, of both surfaces of the cap substrate 8, a surface facing the front surface 2A of the device substrate 2 is denoted as a "front surface 8A" and an outside surface facing the outside of the semiconductor device 1 is denoted as a "back surface 8B."

As the material for the cap substrate 8, a substrate with high flatness such as a semiconductor substrate, glass, sapphire substrate is preferably used. This is because the higher the flatness of the substrate, the more uniform a bonding state becomes, providing stable airtight sealing. The device substrate 2 and the cap substrate 8 are preferably formed of the same material or formed of materials with similar linear thermal expansion coefficients. It is thereby possible to reduce stress caused by a heat history. Note that when a material such as epoxy resin or organic film such as a polyimide film is used, its airtightness tends to decrease.

The via portion 10 is intended to connect the semiconductor circuit 3 with outside parts, and penetrates the device substrate 2 and is exposed to the front surface 2A and the back surface 2B. The via portion 10 is formed by filling the inside of the via hole formed in the device substrate 2 with a metal material. The device substrate 2 is provided with a plurality of via portions 10. A region of each via portion 10 located on the front surface 2A side of the device substrate 2 is connected to any one of the electrode pads 4, 5 and 6, and further connected to the semiconductor circuit 3 via the electrode pad. Each via portion 10 is connected to any one of the ground electrode 11, the input electrode 12 and the output electrode 13 provided on the back surface 2B of the device substrate 2 using a conductive film made of a metal material or the like. Thus, the ground electrode pad 4, the input electrode pad 5 and the output electrode pad 6 are connected to the ground electrode 11, the input electrode 12 and the output electrode 13 respectively via the via portion 10. Note that a cavity 10A of the via portion 10 will be described later with reference to FIG. 29.

On the other hand, the bump portion 14 connects each via portion 10 with the cap substrate 8. That is, all the via portions 10 are connected to the cap substrate 8 via different bump portions 14. These bump portions 14 are arranged in a space between the device substrate 2 and the cap substrate 8 (inside of the hollow part 9) and formed into a columnar shape extending in the direction in which the respective substrates 2 and 8 face each other. More specifically, the bump portion 14 includes two kinds of bump portions 14A and 14B. The bump portion 14A is a bump portion which is not grounded via the via portion 10 and the bump portion 14B is a bump portion which is grounded via the via portion 10.

Some bump portions 14A are each constructed of a columnar bump body 14a formed of, for example, a conductive material, the input electrode pad 5 and the bonding pad 16 as shown in FIG. 2. The input electrode pad 5 is bonded to one end side of the bump body 14a and the via portion 10. The bonding pad 16 is bonded to the other end side of the bump body 14a and the surface 8A of the cap substrate 8. The remaining bump portion 14A is constructed of the bump body 14a, the output electrode pad 6 and the bonding pad 16. The output electrode pad 6 is bonded to one end side of the bump body 14a and the via portion 10. On the other hand, the bump portion 14B is constructed of the bump body 14a, the ground electrode pad 4 and the bonding pad 16 as shown in FIG. 3. The ground electrode pad 4 is bonded to one end side of the bump body 14a and the via portion 10.

The bump portion 14 is intended to increase the strength of the via portion 10. Therefore, the bump portion 14 is preferably formed of a rigid material. More specifically, by forming the bump portion 14 using a metal material, an inorganic insulating film such as silicon oxide film or a material such as polyimide, it is possible to improve the strength of the via portion 10. The bump portion 14 is preferably formed of the same material as that of the sealing frame 7. This can prevent deformation or cracking or the like in the device substrate 2 and the cap substrate 8 due to a difference in a linear thermal expansion coefficient between the sealing frame 7 and the bump portion 14 and improve durability of the semiconductor device 1. Furthermore, when the sealing frame 7 is formed of a metal material, inorganic insulating film or the like, it is possible to cause the sealing frame 7 to stably come into close contact with the substrates 2 and 8, and increase air tightness of the hollow part 9. Note that the bonding pads 15, 16 and 17 shown in FIG. 2 and FIG. 3 will be described later.

Figure 4:
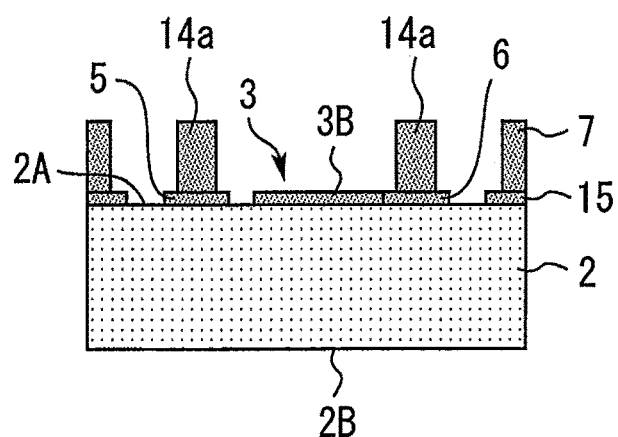
FIG. 4 illustrates a step of forming the semiconductor circuit and the bump portions or the like on the device substrate according to the first embodiment of the present invention.

Next, manufacturing steps of the semiconductor device 1 according to the present embodiment will be described with reference to FIG. 4 to FIG. 8. These drawings are cross-sectional views seen from positions similar to that in FIG. 2. First, FIG. 4 illustrates a step of forming the semiconductor circuit and the bump portions or the like on the device substrate according to the first embodiment of the present invention. In this step, a semiconductor operation layer (not shown) is formed on the front surface 2A side of the device substrate 2 using means like epitaxial growth or the like, and then the semiconductor circuit 3 including a transistor structure is formed using means like photolithography, etching, metal film formation or the like. Furthermore, the electrode pads 4, 5 and 6 are formed by vapor-depositing a metal film such as Au on the front surface 2A side of the device substrate 2 and patterning the metal film. The electrode pads 4, 5 and 6 function as stoppers when via holes are formed from the back surface 2B side of the device substrate 2 by etching, for example.

Furthermore, in the step shown in FIG. 4, the bump bodies 14a are formed on the electrode pads 4, 5 and 6 respectively and the sealing frame 7 is further formed at a position surrounding the semiconductor circuit 3. In this case, each bump body 14a and the sealing frame 7 are preferably formed simultaneously and using the same material to uniformize their bonding states with respect to the substrates 2 and 8. More specifically, a metal paste such as solder is charged onto the device substrate 2 patterned and formed using a resist material or the like. This makes it possible to simultaneously and efficiently form the bump body 14a and the sealing frame 7 having a predetermined pattern in an equal height.

Here, high adhesion may not be achieved when the bump body 14a and the sealing frame 7 are directly patterned to the device substrate 2. It is therefore preferable to form, in advance, the electrode pads 4, 5 and 6 that also serve as joints of the bump body 14a and form the bonding pad 15 that becomes a joint of the sealing frame 7 in the device substrate 2. The bonding pad 15 is formed using means such as vapor deposition and constitutes part of the sealing frame 7. Note that the present invention may also be configured not to form the electrode pads 4, 5 and 6 but to form the bump portion 14 directly on the via portion 10 as will be described later. According to the present invention, the bump portions 14 need to be formed at all the positions of via portions 10, and in addition, the bump portions 14 may also be formed at positions where no via portion 10 exists.

Figure 5:
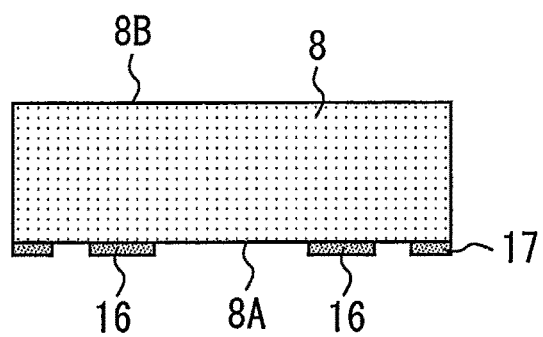
FIG. 5 illustrates a step of forming the bonding pad on the cap substrate.

On the other hand, FIG. 5 illustrates a step of forming the bonding pad on the cap substrate. This step is executed separately from the step shown in FIG. 4. In the step shown in FIG. 5, the bonding pad 16 which becomes a joint of the bump portion 14 and the bonding pad 17 which becomes a joint of the sealing frame 7 are formed on the surface 8A of the cap substrate 8. The bonding pad 16 constitutes part of the bump portion 14. The bonding pad 17 is integrated with the sealing frame 7 and becomes part of the sealing frame 7. Note that FIG. 4 and FIG. 5 illustrate steps in which after the bump body 14a and the sealing frame 7 are formed on the device substrate 2, the bump body 14a and the sealing frame 7 are bonded to the cap substrate 8. However, the present invention is not limited to this, the bump body 14a and the sealing frame 7 may be bonded to the device substrate 2 after forming the bump body 14a and the sealing frame 7 on the cap substrate 8.

Next, FIG. 6 illustrates a step of bonding together the device substrate and the cap substrate. This step is executed after the steps shown in FIG. 4 and FIG. 5. In the step shown in FIG. 6, the sealing frame 7 on the device substrate 2 side and the bonding pad 17 on the cap substrate 8 side (or the cap substrate 8) are press-bonded together using a low-melting-point metal such as solder made of Sn or SnAg. In this step, it is preferable to perform bonding at a temperature of 200· C or higher, for example. Note that as the bonding method in this step, it is also possible to adopt a method of forming a bonding surface for both using the same metal material of Au or the like and bonding the bonding surface using ultrasound. It is also possible to form a thin film using a paste agent in which fine metal particles of Au, Ag, Cu, Pd or Pt are mixed with a solvent, pattern this thin film to thereby form the sealing frame 7 and each bump body 14a, and then press-bond the sealing frame 7 and each bump body 14a at a high temperature of 200· C to 500· C. Furthermore, to stabilize the bonding, it is preferable to reduce the bonding area between the sealing frame 7 and each bump body 14a to the necessary minimum and increase the pressure applied to the joint. More specifically, it is preferable to set the width of the sealing frame 7 to about 20 micrometer and set the diameter of the bump body 14a to about ·50 micrometer.

The heights of the sealing frame 7 and each bump portion 14 (size of protrusion from the device substrate 2 or the cap substrate 8) need only to be larger than that of the semiconductor circuit 3. More specifically, when the semiconductor circuit 3 includes a transistor such as HEMT or HBT, the heights of the sealing frame 7 and each bump portion 14 are basically preferably set to about 3 to 20 micrometer though depending on the amount of output power. Furthermore, in the case of a GaAs high output semiconductor, if thermal resistance of GaAs is high and the device substrate 2 is thick, this is disadvantageous for etching of via holes. For this reason, the thickness of the device substrate 2 is preferably set to about several tens to several hundreds of micrometer.

Cracks or the like may be produced in the device substrate 2 due to a pressure during bonding. Therefore, the device substrate 2 is preferably formed to be thicker than the necessary thickness. In this case, the device substrate 2 is made thinner after bonding, the via holes are etched and the electrodes 11, 12 and 13 are formed. On the other hand, since there is no advantage in making the cap substrate 8 thinner unless the via holes or the like are processed, cracking or the like is unlikely to occur. For this reason, the thickness of the cap substrate 8 may be about 500 micrometer, for example. Note that when via holes or the like are also processed on the cap substrate 8, it is preferable to set the thickness of the cap substrate 8 on the same level with that of the device substrate 2 and make the cap substrate 8 thinner after bonding. Note that FIG. 7 illustrates a step of thinning the device substrate and the cap substrate after bonding.

Next, FIG. 8 illustrates a step of forming the via portions and the electrodes on the back surface side of the device substrate. This step is executed after the step shown in FIG. 6 (and FIG. 7). In the step shown in FIG. 8, a resist pattern is formed through photolithography and then the via holes are formed through dry etching or wet etching. After that, the resist pattern is dissolved by resist-soluble chemical and removed or decomposed through oxygen plasma processing and removed. Next, a conductive film which becomes a seed layer is formed on the back surface 2A side of the device substrate 2 and in the via hole using means such as sputtering and a thick film of conductive metal is formed on the seed layer using an electroless plating method or the like. The conductive metal is basically preferably formed to a film thickness (plating thickness) of several micrometer or above although it depends on a current value flowing through the semiconductor circuit 3. Note that the conductive metal is formed in the via holes conformally or embedded. By patterning the conductive metal formed in this way, each via portion 10 and the electrodes 11, 12 and 13 on the back surface side are formed. At this time, the electrodes 11, 12 and 13 are formed by being separated from each other. An example of the patterning method is a method whereby resist patterns are formed on each via portion 10 and the electrodes 11, 12 and 13, and etching is performed using wet chemical.

Note that when the conductive metal is Au plated film, a iodine potassium iodide aqueous solution may be used as the wet chemical. Note that steps executed from bonding between substrates onward, that is, a device substrate thinning step and via formation step or the like may be executed before bonding between the substrates.

Figure 9:
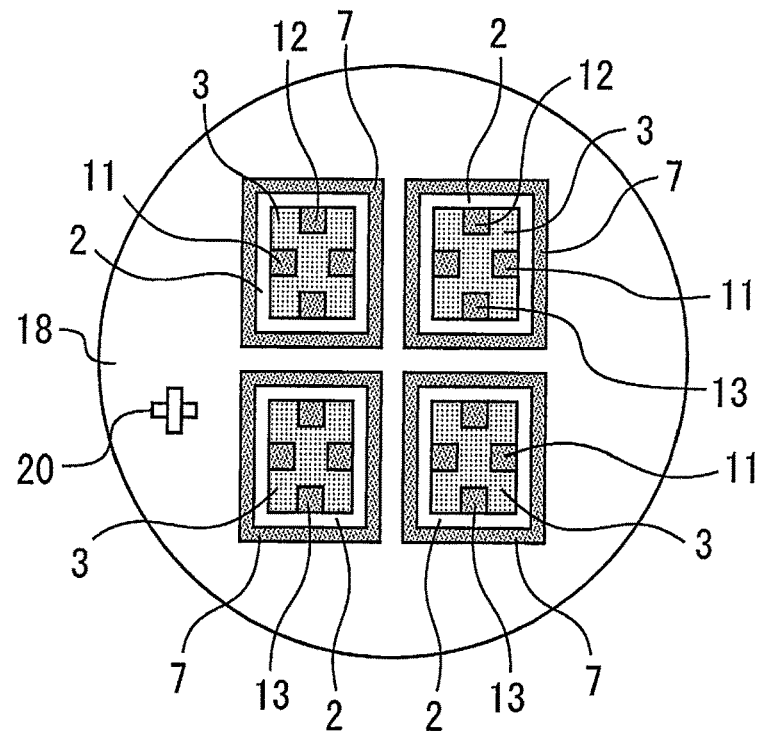
FIG. 9 is a diagram illustrating a step of forming many device substrates and components on the substrate side on a wafer.
Figure 10:
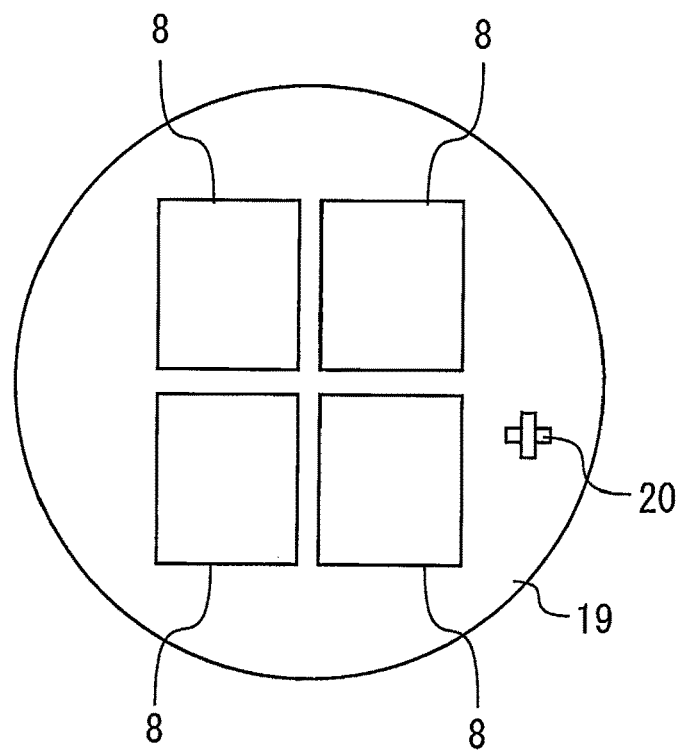
FIG. 10 is a diagram illustrating many cap substrates and components on the substrate side on a wafer.

The semiconductor device 1 can be manufactured in the above-described steps. These steps can be executed by forming many device substrates 2 and cap substrates 8 on wafers 18 and 19 as shown, for example, in FIG. 9 and FIG. 10 and bonding together the wafers 18 and 19. This makes it possible to manufacture many semiconductor devices 1 collectively and efficiently. Note that FIG. 9 is a diagram illustrating a step of forming many device substrates and components on the substrate side on a wafer. FIG. 10 is a diagram illustrating many cap substrates and components on the substrate side on a wafer. A mark 20 in these drawings is a positioning mark to form the individual device substrates 2 and cap substrates 8 on the wafers 18 and 19 at positions at which the device substrates 2 and cap substrates 8 can abut against each other.

Figure 11:
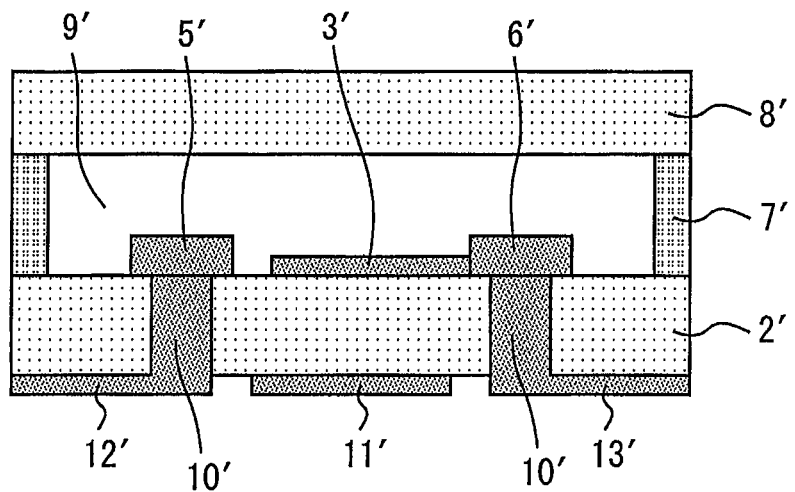
FIG. 11 is a cross-sectional view illustrating an example of a semiconductor device of the prior art.
Figure 12:
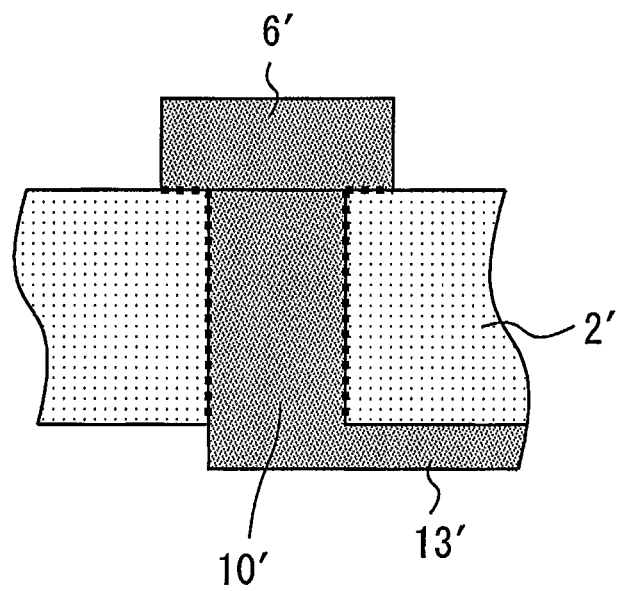
FIG. 12 is an enlarged view of main parts illustrating a region in FIG. 11 in which airtightness breakdown occurs.

The aforementioned semiconductor device 1 can obtain the following operations and effects, for example. First, the problems of the prior arts will be described with reference to FIG. 11 and FIG. 12. FIG. 11 is a cross-sectional view illustrating an example of a semiconductor device of the prior art and FIG. 12 is an enlarged view of main parts illustrating a region in FIG. 11 in which airtightness breakdown occurs. Note that in FIG. 11 and FIG. 12, components common to those in the semiconductor device 1 of the present embodiment are denoted by the same reference numerals suffixed with "'(dash)."

Generally, a deposited substance or the like generated during etching exists on a side wall of a via hole formed in a device substrate 2'. For this reason, even when a conductive metal is formed in close contact with the side wall, close adhesion is likely to deteriorate. Moreover, the conductive metal in the via hole has a linear thermal expansion coefficient different from that of the device substrate 2'. For this reason, when a heat history is added to the semiconductor device, the conductive metal in the via hole may be peeled, for example, at portions marked with • in FIG. 12 or stress may be added to electrode pads 5' and 6' bonded to the conductive metal, causing the electrode pad to be peeled, and as a result there is a problem that airtightness breakdown occurs in a hollow part 9'. In the semiconductor devices described in PTLs 1, 2 and 3, there are via portions which are not reinforced by bump portions, and so it is difficult to keep air tightness in the hollow part.

In contrast, the present embodiment adopts a configuration in which the bump portions 14 are formed on all the via portions 10 and the bump portions 14 are bonded to the cap substrate 8. According to this configuration, the bump portions 14 supported by the cap substrate 8 can reinforce the via portions 10 and suppress deformation, peeling or the like of the conductive metal and the electrode pads 4, 5 and 6 in the via portions 10. This makes it possible to increase bonding reliability between the device substrate 2 and the cap substrate 8, and stably keep air tightness of the hollow part 9. Therefore, according to the present embodiment, it is possible to improve yield and durability of the semiconductor device 1.

Furthermore, by forming the sealing frame 7 and the bump portion 14 using the same material, it is possible to reduce stress on the device substrate 2 and the cap substrate 8 caused by a heat history. One such example is that bonding is performed at a high temperature of 200· C or higher in the step of bonding the substrates 2 and 8, and so if the linear thermal expansion coefficient of the sealing frame 7 is different from that of the bump portion 14, stress is likely to remain between the substrates 2 and 8 when the temperature is lowered to a normal temperature. According to the present embodiment, it is possible to prevent cracking, peeling of the substrates 2 and 8, deformation of the bump portion 14 and the sealing frame 7 or the like caused by such stress and stably secure air tightness of the hollow part 9. In the semiconductor device described in PTL 3, bump portions are formed in only some via portions, the cap substrate is etched instead of the sealing frame and hollow parts are formed. Therefore, when a heat history is added, stress is added to the joint between the substrate and the bump portion and the joint between the cap substrate and the device substrate or the like due to a difference in the linear thermal expansion coefficient between the cap substrate and the bump portion, and this may cause cracking. The present embodiment can avoid such problems.

Furthermore, the present embodiment allows the device substrate 2 and the cap substrate 8 to be formed of the same material. In this case, it is possible to set the linear thermal expansion coefficients of the substrates 2 and 8 to the same value, and suppress stress generated in the sealing frame 7 and the bump portion 14 between the substrates 2 and 8 when a heat history is added. Therefore, it is possible to improve strength of the joints and stably secure air tightness of the hollow part 9.

In the present embodiment, the sealing frame 7 and the bump portion 14 are formed of a metal material such as Au, Ag, Cu, Pt or Pd, or a conductive material including an alloy of such metals. It is thereby possible to connect the semiconductor circuit 3 to the ground electrode 11, the input electrode 12 and the output electrode 13 using the highly conductive bump portions 14. Therefore, it is possible to simplify a structure of extracting the electrode pads 4, 5 and 6 while reinforcing the via portions 10 with the bump portions 14 and facilitate extraction of the electrodes. Furthermore, it is possible to reduce losses in input/output signal and power, and implement the power saving type semiconductor device 1. Note that in the present invention, only at least part of the bump portions 14 need to be formed of the above-described metal material or an alloy thereof and some other part of the bump portions 14 may be formed of another metal material or an insulating material.

In the present embodiment, the sealing frame 7 and the bump portion 14 are formed to the same height, and the device substrate 2 and the cap substrate 8 are formed into a tabular shape where no concave parts or the like exist. This configuration allows the hollow part 9 to be formed between the substrates 2 and 8 without applying processing on concave parts or the like to the device substrate 2 and the cap substrate 8. This makes it possible to simplify the processing step of the substrates 2 and 8 and reduce process costs.

Note that the present embodiment has illustrated the ground electrode 11, the input electrode 12 and the output electrode 13 as examples of electrodes whereby a signal is extracted from the semiconductor circuit 3. However, theses electrodes 11, 12 and 13 are examples and do not limit the present invention. One of the electrodes whereby a signal is extracted from the semiconductor circuit 3 needs to be connected to the electromagnetic shield metal and the other electrodes are electrically separated through the structure proposed in the present embodiment. Examples of such an electrode include testing electrodes for confirmation of electric characteristics in addition to the input/output electrodes.

Second Embodiment

Figure 13:
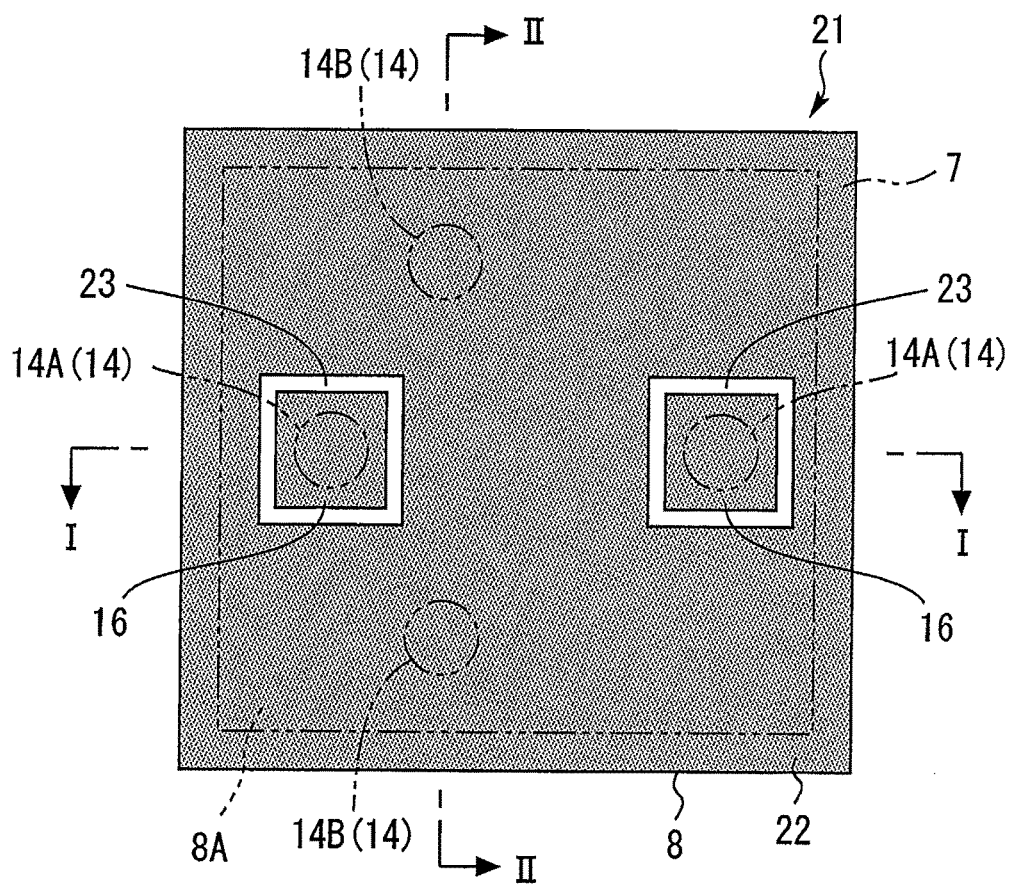
FIG. 13 is a bottom view of the cap substrate of the semiconductor device according to the second embodiment of the present invention seen from the device substrate side.
Figure 14:
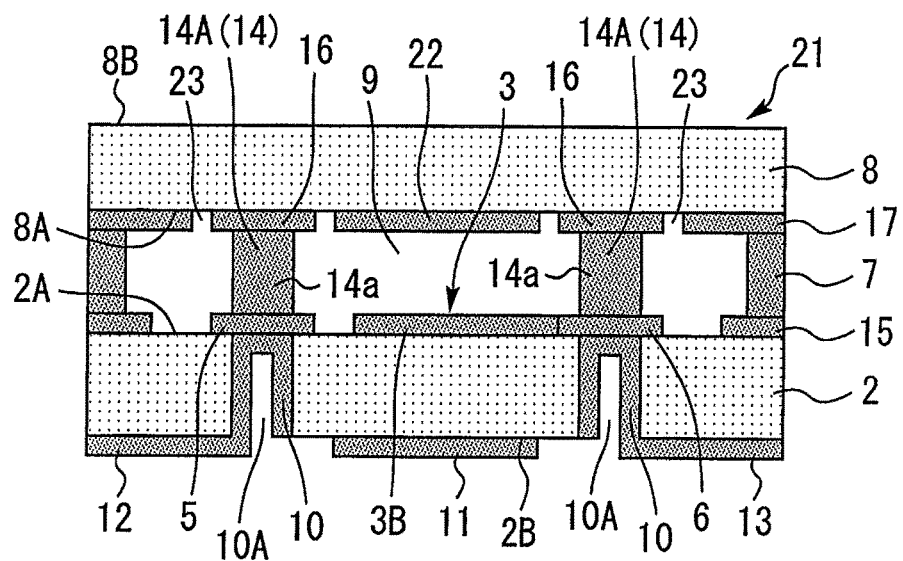
FIG. 14 is a cross-sectional view of the semiconductor device exploded at a position shown by an arrowed line I-I in FIG. 13.
Figure 15:
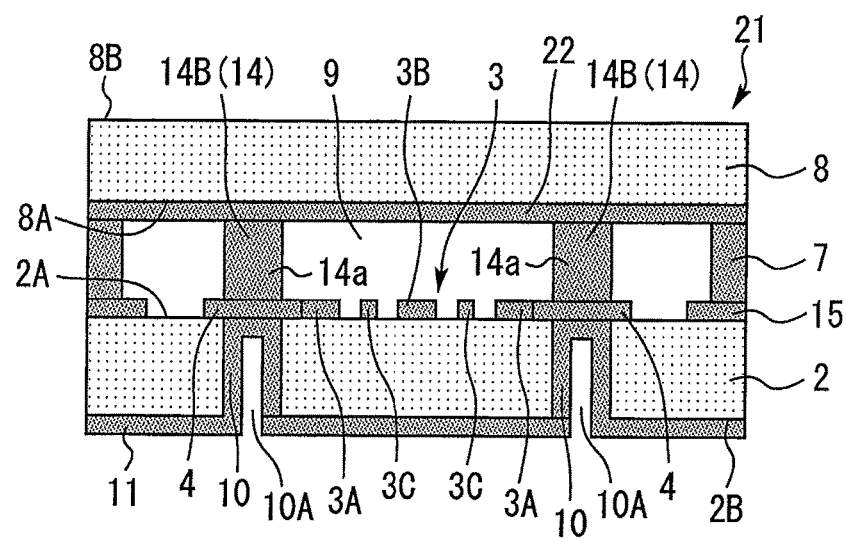
FIG. 15 is a cross-sectional view of the semiconductor device exploded at a position shown by an arrowed line II-II in FIG. 13.

Next, a second embodiment of the present invention will be described with reference to FIG. 13 to FIG. 15. A feature of the present embodiment is that a conductive film is formed on the back surface of the cap substrate. FIG. 13 is a bottom view of the cap substrate of the semiconductor device according to the second embodiment of the present invention seen from the device substrate side. FIG. 14 is a cross-sectional view of the semiconductor device exploded at a position shown by an arrowed line I-I in FIG. 13 and FIG. 15 is a cross-sectional view of the semiconductor device exploded at a position shown by an arrowed line II-II in FIG. 13. Note that a plan view of the semiconductor device 21 according to the present embodiment is similar to that in FIG. 1. As shown in FIG. 13 to FIG. 15, although the semiconductor device 21 is constructed substantially similarly to the semiconductor device 1 according to the first embodiment, it is provided with a conductive film 22 formed on the surface 8A of the cap substrate 8.

The conductive film 22 constitutes an electromagnetic shield film of the semiconductor device 21 and is formed of a conductive material (preferably, metal material similar to that of the bonding pad 16). Furthermore, the conductive film 22 covers the surface 8A of the cap substrate 8 except for peripheral portions of some bump portions 14A as shown in FIG. 13 and FIG. 14. That is, the conductive film 22 is formed so as to enclose the bonding pad 16 of the bump portion 14A and an insulating gap 23 enclosing the bonding pad 16 is formed between the bonding pad 16 and the conductive film 22. In this way, the conductive film 22 is separated and insulated from the bump portion 14A and the bonding pad 16.

On the other hand, the conductive film 22 is integrated with the bonding pad 16 (see FIG. 3) of the bump portion 14B and the bonding pad 17 of the sealing frame 7 as shown in FIG. 15. Thus, the conductive film 22 covers the whole surface 8A of the cap substrate 8 except peripheral portions of the bump portion 14A. The conductive film 22 is grounded via the bump portion 14B, the via portions 10 and the ground electrode 11 while being insulated by the insulating gap 23 from the input electrode pad 5 and the output electrode pad 6. Furthermore, since the sealing frame 7 formed of a conductive material is connected to the conductive film 22, the sealing frame 7 is grounded through a path similar to that of the conductive film 22. Thus, substantially the whole perimeter of the semiconductor circuit 3 is electromagnetically shielded by the conductive film 22, the sealing frame 7 and the ground electrode 11.

According to the present embodiment configured in this way, it is possible to obtain high electromagnetic shielding performance compared to the prior arts described in PTLs 4 and 5. That is, according to these prior arts, there is a certain part of the side face of the device where no electromagnetic shield film is formed and the electromagnetic shield film does not completely cover the device. For this reason, the electromagnetic shielding performance is insufficient, which may cause radiation or intrusion of electromagnetic wave. In contrast, according to the present embodiment, it is possible to electromagnetically shield the semiconductor circuit 3 using the conductive film 22, the sealing frame 7 and the ground electrode 11 from above, below and side in FIG. 15 (cap substrate 8 side, device substrate 2 side and sealing frame 7 side), over substantially the whole semiconductor circuit 3. Therefore, the operation of the semiconductor circuit 3 can be stabilized against radio wave from outside and unnecessary radiation from the semiconductor circuit 3 itself. Operations of devices arranged around the semiconductor device 21 can also be stabilized.

Furthermore, the insulating gap 23 is preferably formed so as to have a width smaller than the wavelength of electromagnetic wave handled in the semiconductor circuit 3. This makes it possible to reduce influences of the electromagnetic wave on the input electrode pad 5 and the output electrode pad 6, and further improve the electromagnetic shielding performance. According to the present embodiment, the conductive film 22 can be connected to the ground electrode 11 side using the bump portion 14B. This makes it possible to simplify the wiring structure of electromagnetic shielding in addition to effects similar to those of the first embodiment and easily form the semiconductor device 21 with high reliability.

Third Embodiment

Figure 16:
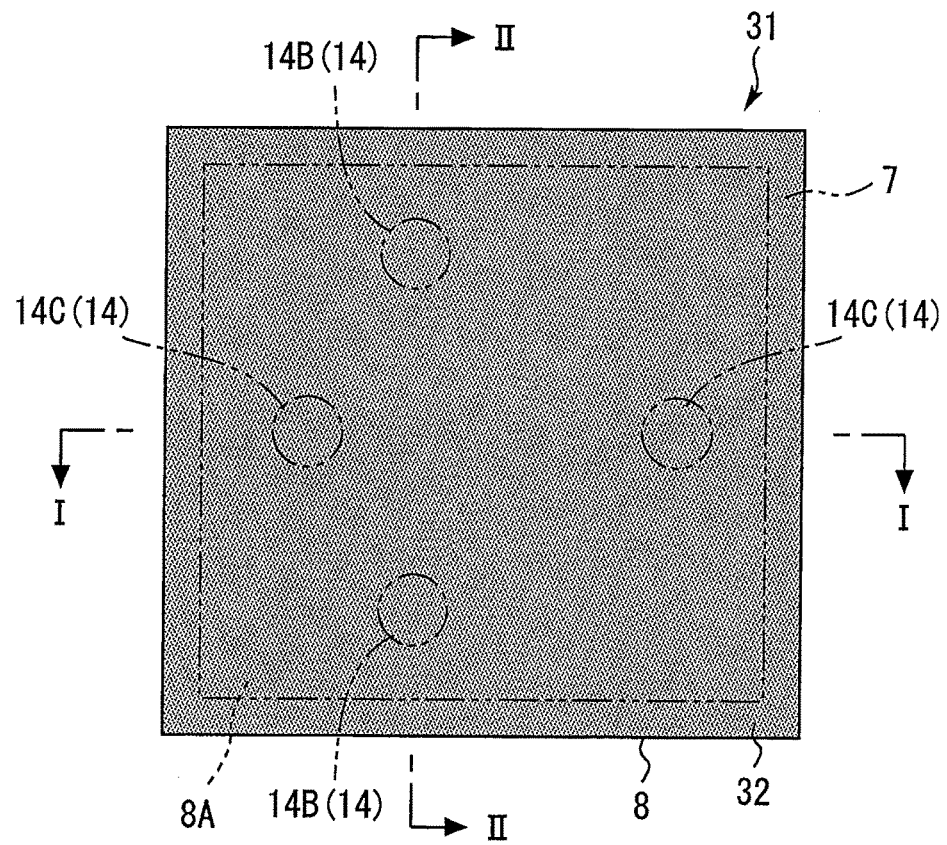
FIG. 16 is a bottom view of the cap substrate of the semiconductor device according to the third embodiment of the present invention seen from the device substrate side.
Figure 17:
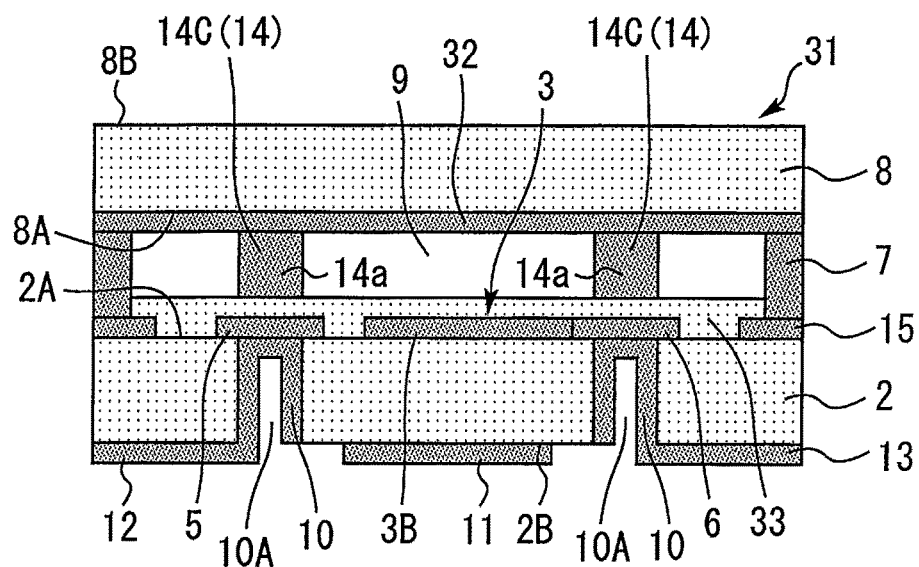
FIG. 17 is a cross-sectional view of the semiconductor device exploded at a position shown by an arrowed line I-I in FIG. 16.
Figure 18:
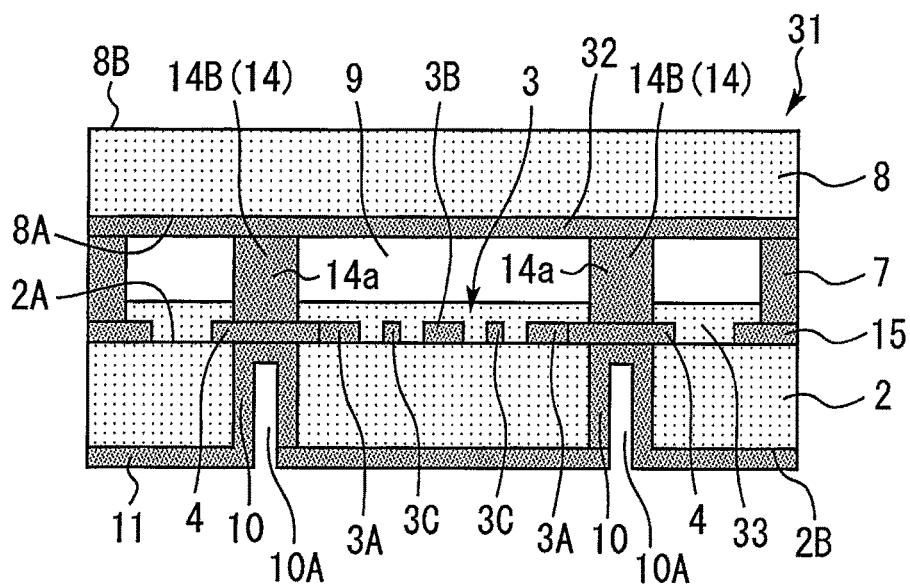
FIG. 18 is a cross-sectional view of the semiconductor device exploded at a position shown by an arrowed line II-II in FIG. 16.

Next, a third embodiment of the present invention will be described with reference to FIG. 16 to FIG. 18. A feature of the present embodiment is that at least part of the bump portions are formed of an insulating material instead of the insulating gap of the second embodiment. FIG. 16 is a bottom view of the cap substrate of the semiconductor device according to the third embodiment of the present invention seen from the device substrate side. Furthermore, FIG. 17 is a cross-sectional view of the semiconductor device exploded at a position shown by an arrowed line I-I in FIG. 16 and FIG. 18 is a cross-sectional view of the semiconductor device exploded at a position shown by an arrowed line II-II in FIG. 16. Note that a plan view of the semiconductor device 31 according to the present embodiment is similar to that in FIG. 1.

As shown in FIG. 16 to FIG. 18, the semiconductor device 31 is constructed substantially similarly to the semiconductor device 21 according to the second embodiment. However, the bump portion 14 is provided with the bump portion 14B and a bump portion 14C disposed instead of the bump portion 14A. The semiconductor device 31 is also provided with a conductive film 32 which is an electromagnetic shield film formed on the surface 8A of the cap substrate 8 and an insulating film 33 formed on the front surface 2A side of the device substrate 2 using an insulating material.

The insulating film 33 is formed of, for example, an SiN film and has a thickness of about 200 nm. Such an insulating film 33 can be formed using, for example, a plasma CVD apparatus. The insulating film 33 covers the semiconductor circuit 3 and the electrode pads 5 and 6. The insulating film 33 is removed at positions of the sealing frame 7 and the bump portion 14B using means such as etching as shown in FIG. 18.

Part of the bump portion 14C is constructed of the insulating film 33. To be more specific, the bump body 14a of the bump portion 14C is connected to the input electrode pad 5 and the output electrode pad 6 via the insulating film 33. Thus, the bump portion 14C keeps the conductive film 32 insulated from the input electrode pad 5 and the output electrode pad 6 while connecting together the via portion 10 and the cap substrate 8. As a result, the conductive film 32 covers the entire surface 8A of the cap substrate 8 as shown in FIG. 16 to FIG. 18. Furthermore, the conductive film 32 also serves as all the bonding pads 16 (see FIG. 3) formed on the cap substrate 8.

According to the present embodiment configured in this way, the conductive film 32 need not be provided with any insulating gap for insulating the conductive film 32 from the input electrode pad 5 and the output electrode pad 6. Therefore, the conductive film 32 can completely cover the surface 8A of the cap substrate 8. As a result, it is possible to further improve electromagnetic shielding performance of the semiconductor device 31 in addition to effects similar to those of the second embodiment.

Fourth Embodiment

Figure 19:
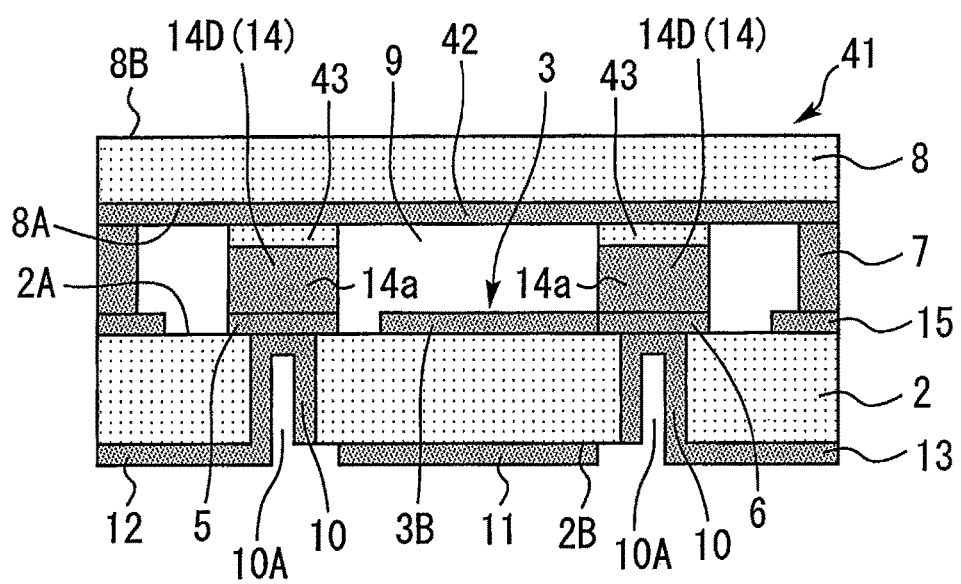
FIG. 19 is a cross-sectional view of a semiconductor device according to the fourth embodiment of the present invention seen from a position similar to that in FIG. 2.

Next, a fourth embodiment of the present invention will be described with reference to FIG. 19. A feature of the present embodiment is that regions of the bump portions different from those in the third embodiment are formed of an insulating material. FIG. 19 is a cross-sectional view of a semiconductor device according to the fourth embodiment of the present invention seen from a position similar to that in FIG. 2. The semiconductor device 41 according to the present embodiment is provided with a conductive film 42 and an insulating film 43. The bump portion 14 of the semiconductor device 41 is provided with the bump portion 14B and a bump portion 14D disposed instead of the bump portion 14A.

The conductive film 42 is formed of a conductive material and formed on the entire surface 8A of the cap substrate 8, constituting an electromagnetic shield film. The insulating film 43 is formed on the conductive film 42 at a position of the bump portion 14D. Part of the bump portion 14D located on the cap substrate 8 side is composed of the insulating film 43. That is, the bump body 14a is connected to the conductive film 42 via the insulating film 43. Thus, the bump portion 14D keeps the conductive film 42 insulated from the input electrode pad 5 and the output electrode pad 6 while connecting together the via portion 10 and the cap substrate 8. The present embodiment configured in this way can also obtain effects similar to those of the third embodiment.

Fifth Embodiment

Figure 20:
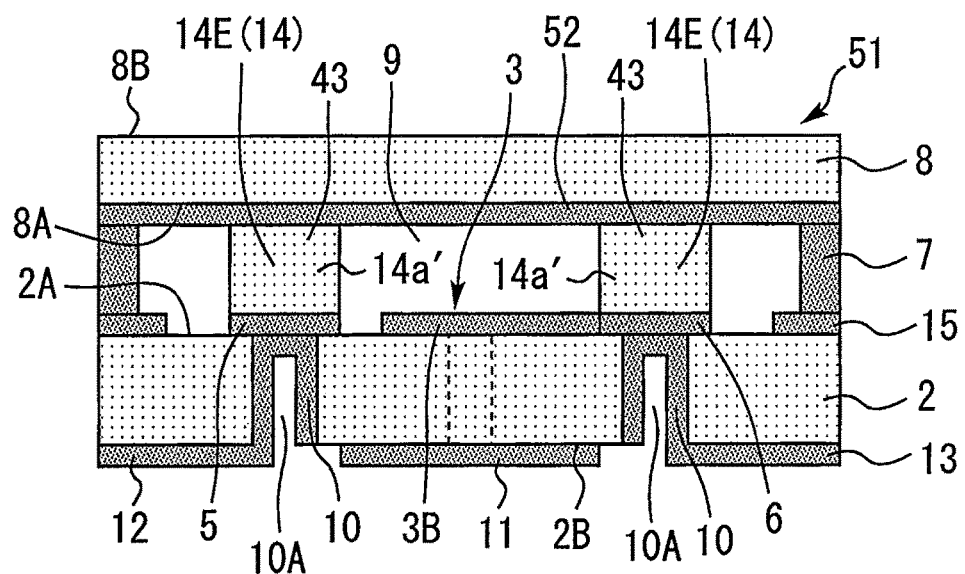
FIG. 20 is a cross-sectional view of a semiconductor device according to the fifth embodiment of the present invention seen from a position similar to that in FIG. 2.

Next, a fifth embodiment of the present invention will be described with reference to FIG. 20. A feature of the present embodiment is that the whole bump portion is formed of an insulating material. FIG. 20 is a cross-sectional view of a semiconductor device according to the fifth embodiment of the present invention seen from a position similar to that in FIG. 2. The semiconductor device 51 according to the present embodiment is provided with a conductive film 52 which is an electromagnetic shield film formed similarly to that of the fourth embodiment. The bump portion 14 of the semiconductor device 51 is provided with the bump portion 14B and a bump portion 14E disposed instead of the bump portion 14A.

The bump portion 14E includes a bump body 14a' formed of an insulating material and is connected to the conductive film 52. Thus, the bump portion 14E keeps the conductive film 52 insulated from the input electrode pad 5 and the output electrode pad 6 while connecting together the via portion 10 and the cap substrate 8. The present embodiment configured in this way can also obtain effects similar to those of the third embodiment.

Sixth Embodiment

Figure 21:
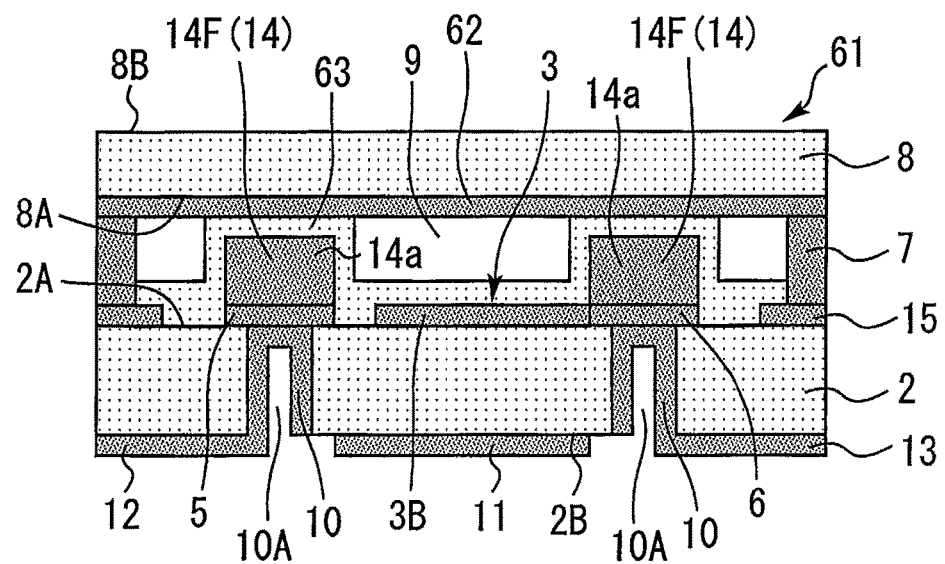
FIG. 21 is a cross-sectional view of a semiconductor device according to the sixth embodiment of the present invention seen from a position similar to that in FIG. 2.

Next, a sixth embodiment of the present invention will be described with reference to FIG. 21. A feature of the present embodiment is that the semiconductor circuit is covered with an insulating film and at least part of the bump portions are formed of this insulating film. FIG. 21 is a cross-sectional view of a semiconductor device according to the sixth embodiment of the present invention seen from a position similar to that in FIG. 2. The semiconductor device 61 according to the present embodiment is provided with a conductive film 62 which is an electromagnetic shield film formed similarly to that of the fourth embodiment and an insulating film 63. The bump portion 14 of the semiconductor device 61 is provided with the bump portion 14B and a bump portion 14F disposed instead of the bump portion 14A.

The insulating film 63 is formed of, for example, an SiN film as in the case of the third embodiment and covers the semiconductor circuit 3 and the electrode pads 5 and 6. The insulating film 63 is removed at positions of the sealing frame 7 and the bump portion 14B using means such as etching. Furthermore, the insulating film 63 covers the bump body 14a of the bump portion 14F from the cap substrate 8 side. That is, part of the bump portion 14F located on the cap substrate 8 side is constructed of the insulating film 63 and the bump body 14a is connected to the conductive film 62 via the insulating film 63. Thus, the bump portion 14F keeps the conductive film 62 insulated from the input electrode pad 5 and the output electrode pad 6 while connecting together the via portion 10 and the cap substrate 8. The present embodiment configured in this way can obtain effects similar to those of the third embodiment.

Note that in the third to sixth embodiments, at least part of the bump portions 14C, 14D, 14E and 14F are formed of an insulating material, but in the present invention, at least part of all the bump portions 14 may be formed of an insulating material.

Seventh Embodiment

Figure 22:
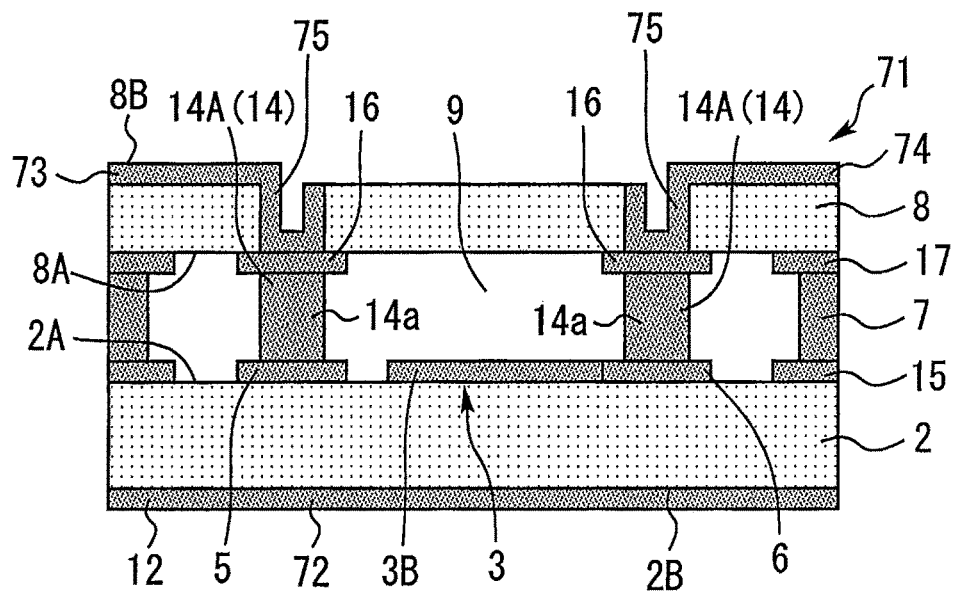
FIG. 22 is a cross-sectional view of a semiconductor device according to the seventh embodiment of the present invention seen from a position similar to that in FIG. 2.
Figure 23:
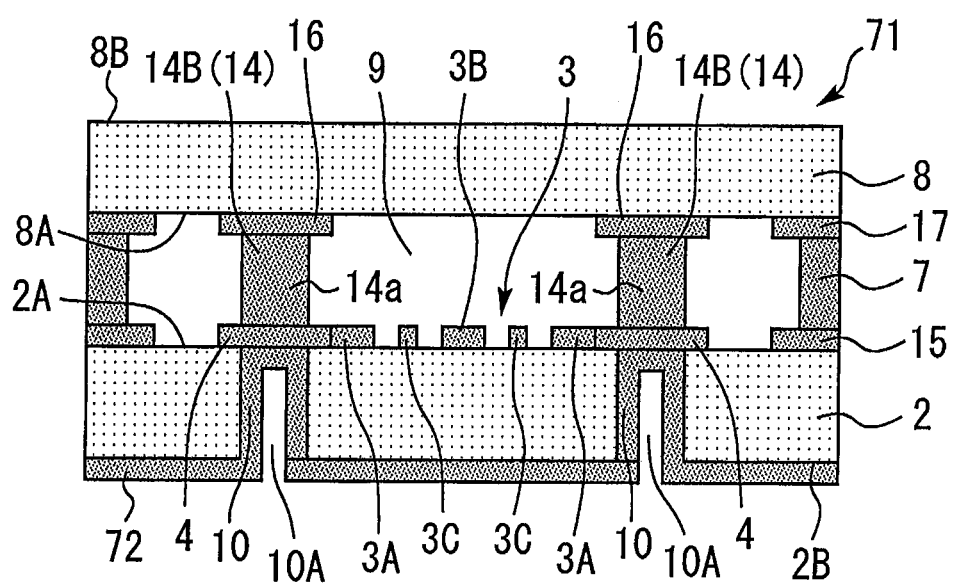
FIG. 23 is a cross-sectional view of the semiconductor device seen from a position similar to that in FIG. 3.
Figure 24:
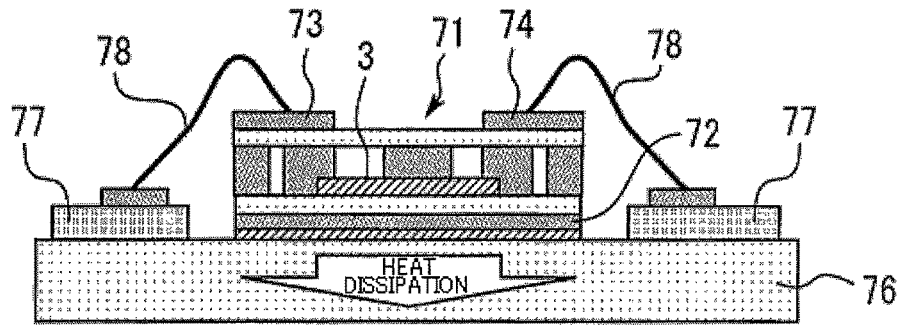
FIG. 24 is a cross-sectional view schematically illustrating the semiconductor device according to the seventh embodiment of the present invention mounted on a base member.

Next, a seventh embodiment of the present invention will be described with reference to FIG. 22 to FIG. 25. A feature of the present embodiment is that via portions are formed also in the cap substrate. FIG. 22 is a cross-sectional view of a semiconductor device according to the seventh embodiment of the present invention seen from a position similar to that in FIG. 2 and FIG. 23 is a cross-sectional view of the semiconductor device seen from a position similar to that in FIG. 3. FIG. 24 is a cross-sectional view schematically illustrating the semiconductor device according to the seventh embodiment of the present invention mounted on a base member. Note that a plan view of the semiconductor device 71 according to the present embodiment is similar to that in FIG. 1. Since FIG. 24 is a simplified drawing for the purpose of illustrating a mounting state, shapes of respective parts may be different from those in other drawings.

As shown in FIG. 22 and FIG. 23, although the semiconductor device 71 is configured similarly to that of the first embodiment, only a ground electrode 72 is formed on the back surface 2B of the device substrate 2, and the input electrode 73 and the output electrode 74 are formed on the back surface 8B of the cap substrate 8. Therefore, as shown in FIG. 23, none of the input electrode or the output electrode exists on the back surface 2B of the device substrate 2, and so the ground electrode 72 is formed as a single flat conductive film that covers the entire back surface 2B and is connected to the ground electrode pad 4 via some of the via portions 10.

On the other hand, as shown in FIG. 22, the cap substrate 8 is provided with a plurality of via portions 75 formed similarly to the via portions 10 of the device substrate 2. These via portions 75 are formed by filling the interior of the via holes formed in the cap substrate 8 with a metal material, penetrate the cap substrate 8 and are exposed to the surface 8A and the back surface 8B. The input electrode 73 is connected to the input electrode pad 5 via some of the via portions 75 and bump portions 14A. On the other hand, the output electrode 74 is connected to the output electrode pad 6 via some other via portions 75 and bump portions 14A.

In this state, the bump portion 14A connects the via portion 75 on the cap substrate 8 side and the device substrate 2 together to constitute a second bump portion. On the other hand, the bump portion 14B connects the via portion 10 on the device substrate 2 side and the cap substrate 8 together to constitute a first bump portion. The present embodiment illustrates a case where the second bump portion 14A is used for reinforcement of the via portion 75 and for an external connection of the semiconductor circuit 3 and the first bump portion 14B is used only for reinforcement of the via portion 10 and not for an external connection of the semiconductor circuit 3.

The semiconductor device 71 configured in this way can provide the ground electrode 72 formed of a single conductive film over the entire back surface 2B of the device substrate 2, and can thereby improve heat dissipation. More specifically, the semiconductor device 71 is used, mounted on a base member 76 made up of a flat metal plate of Cu, CuW or the like and as shown in FIG. 24. Since the semiconductor circuit 3 constitutes a heat source in the high output semiconductor device 71 in particular, the semiconductor circuit 3 is used by die bonding it to the base member 76 excellent in heat dissipation. For example, solder of AuSn is used for die bonding. When die-bonding the semiconductor device 71, the entire back surface 2B side of the device substrate 2, that is, the entire ground electrode 72 is bonded to the base member 76 in a surface contacted condition, and it is thereby possible to improve heat dissipation of the semiconductor device 71. Note that a matching substrate 77 is provided on the base member 76 and the input electrode 73 and the output electrode 74 are connected to the matching substrate 77 by means of wire bonding 78.

Figure 25:
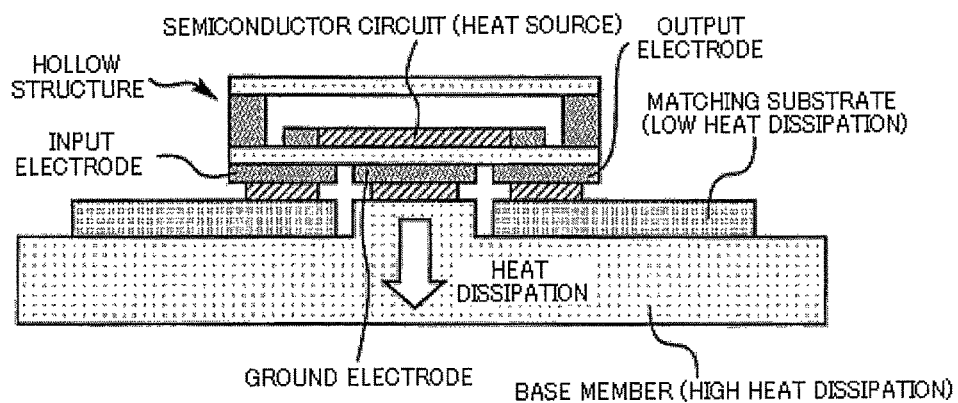
FIG. 25 is a cross-sectional view illustrating a mounting state of a semiconductor device according to the prior art.

Here, FIG. 25 is a cross-sectional view illustrating a mounting state of a semiconductor device according to the prior art. This drawing schematically illustrates a configuration of the prior arts described in PTLs 1, 2 and 3, for example. As shown in FIG. 25, according to the prior arts, the input electrode, the output electrode and the ground electrode are all arranged on the back surface side of the device substrate. For this reason, when the semiconductor device is mounted on the base member, the input electrode and the output electrode are connected to the matching substrate, and only the ground electrode is bonded to the base member. As a result, according to the prior art, a heat dissipation path from the semiconductor device to the base member is limited to only the ground electrode of the device substrate, and the area of the heat dissipation path becomes smaller than the area of the device substrate, and this results in a problem that heat dissipation deteriorates. According to the prior art described in, for example, PTL 4, the back surface side of the substrate on which the chip is mounted is not a single electrode such as the ground electrode and this results in a problem similar to the problem with the configuration shown in FIG. 25.

In contrast, according to the present embodiment, heat can be dissipated from the entire back surface 2B of the device substrate 2 to the base member 76, and so heat dissipation of the semiconductor device 71 can be improved. According to the prior art shown in FIG. 25, the height position at which the input electrode and the output electrode are connected to the matching substrate is different from the height position at which the ground electrode is connected to the base member by an amount corresponding to the thickness of the matching substrate. For this reason, a convex part needs to be formed in the base member to absorb the difference in the height of connection positions, resulting in a problem that the machining cost of the base member increases. The present embodiment can also solve this problem. Therefore, according to the present embodiment, it is possible to implement the semiconductor device 71 having high heat dissipation performance in addition to the effects similar to those of the first embodiment.

Eighth Embodiment

Figure 26:
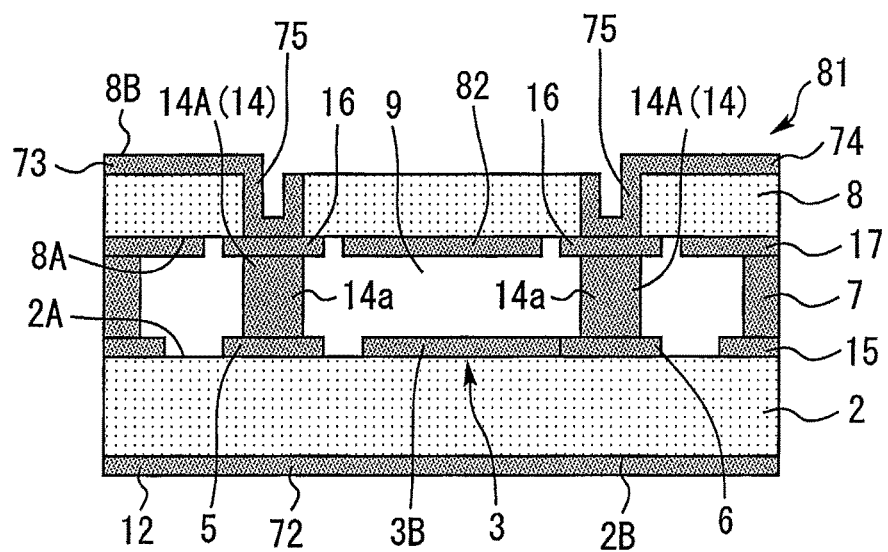
FIG. 26 is a cross-sectional view of a semiconductor device according to the eight embodiment of the present invention seen from a position similar to that in FIG. 2.
Figure 27:
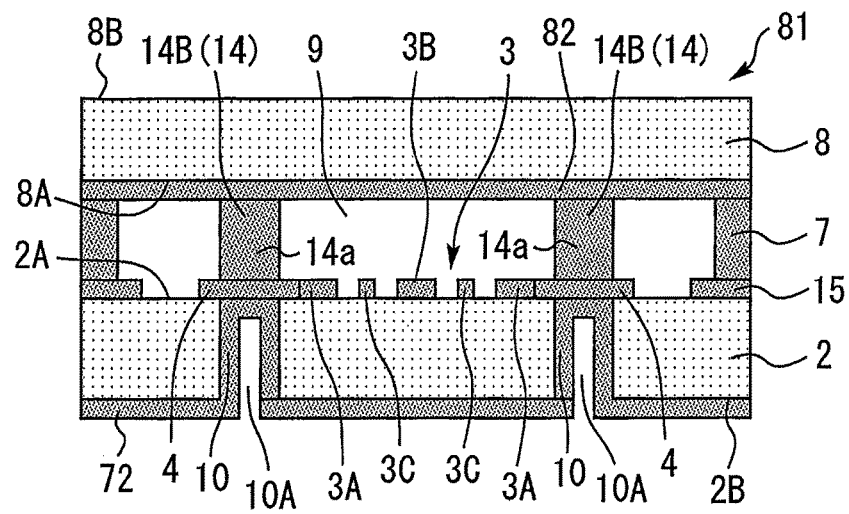
FIG. 27 is a cross-sectional view of the semiconductor device according to the eight embodiment of the present invention seen from a position similar to that in FIG. 3.

Next, an eighth embodiment of the present invention will be described with reference to FIG. 26 and FIG. 27. A feature of the present embodiment is that a conductive film that covers the entire back surface of the cap substrate is formed for the semiconductor device according to the seventh embodiment. FIG. 26 is a cross-sectional view of a semiconductor device according to the eight embodiment of the present invention seen from a position similar to that in FIG. 2. FIG. 27 is a cross-sectional view of the semiconductor device according to the eight embodiment of the present invention seen from a position similar to that in FIG. 3. Note that a plan view of the semiconductor device 81 according to the present embodiment is similar to that in FIG. 1.

As shown in FIG. 26 and FIG. 27, the semiconductor device 81 is constructed similarly to that of the seventh embodiment, but this semiconductor device 81 is provided with a conductive film 82 which is an electromagnetic shield film formed on the surface 8A of the cap substrate 8. Similarly to the second embodiment, the conductive film 82 covers the surface 8A of the cap substrate 8 except for peripheral portions of some of the bump portions 14A and is insulated and separated from the bump portion 14A and the bonding pad 16. The bump portion 14B is grounded via the ground electrode pad 4 and the ground electrode 72.

The present embodiment configured in this way can obtain effects combining the effects of the second and seventh embodiments. Therefore, it is possible to implement the semiconductor device 81 with high electromagnetic shielding performance and heat dissipation.

Ninth Embodiment

Figure 28:
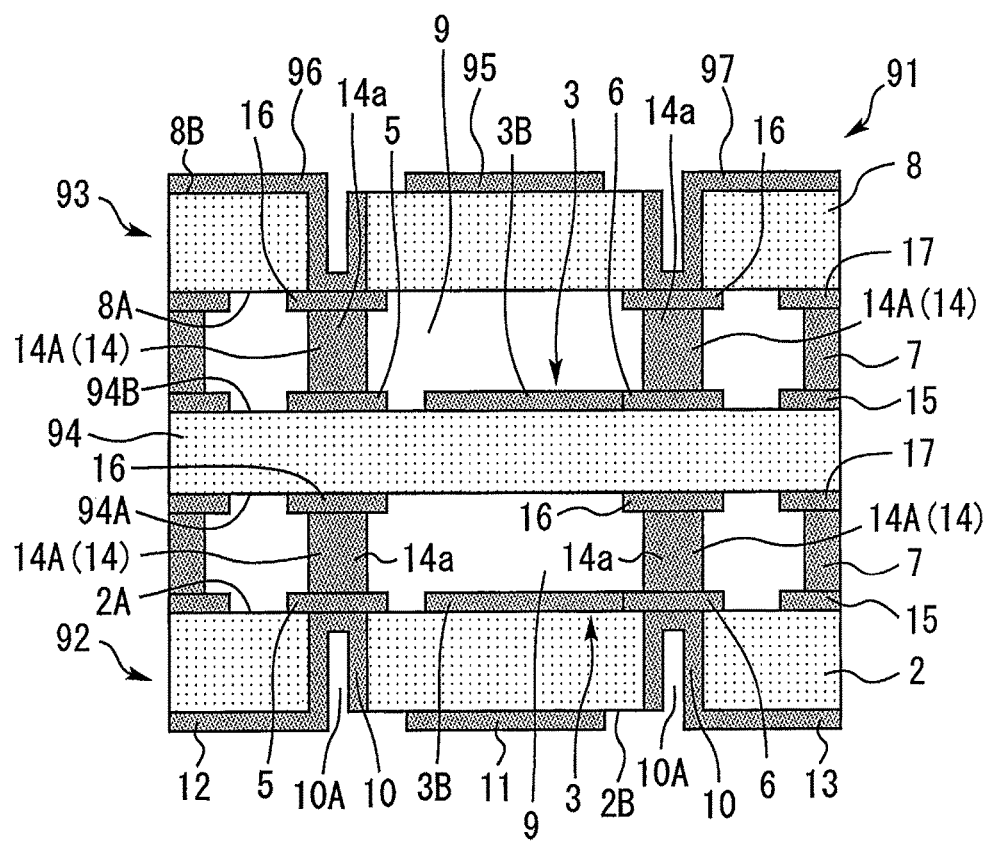
FIG. 28 is a cross-sectional view of a semiconductor device according to the ninth embodiment of the present invention seen from a position similar to that in FIG. 2.

Next, a ninth embodiment of the present invention will be described with reference to FIG. 28. A feature of the present embodiment is that another semiconductor circuit is provided on the front surface side of the cap substrate. FIG. 28 is a cross-sectional view of a semiconductor device according to the ninth embodiment of the present invention seen from a position similar to that in FIG. 2. As shown in this drawing, the semiconductor device 91 according to the present embodiment is constructed by vertically laminating two semiconductor chips 92 and 93, for example. The semiconductor chips 92 and 93 are constructed substantially similarly to the semiconductor device 1 described in, for example, the first embodiment.

A common substrate 94 is obtained by communalizing the cap substrate of the semiconductor chip 92 and the device substrate of the semiconductor chip 93, and includes a front surface 94A and a back surface 94B. The semiconductor circuit 3 of the semiconductor chip 93 is formed on the back surface 94B side of the common substrate 94. Furthermore, a ground electrode 95, an input electrode 96 and an output electrode 97 of the semiconductor chip 93 are provided on the back surface 8B side of the cap substrate 8 of the semiconductor chip 93. These electrodes 95, 96 and 97 are connected to the semiconductor circuit 3 via the bump portions 14. Note that an example has been illustrated in FIG. 28 where the two semiconductor chips 92 and 93 are laminated, but the present invention may also be applicable to configurations in which three or more or any number of semiconductor chips are laminated. Furthermore, the present invention may also be configured such that via portions are formed in the common substrate 94, and the semiconductor circuit 3 of the semiconductor chip 92 and the semiconductor circuit 3 of the semiconductor chip 93 are connected together via these via portions. This makes it possible to shorten a connection distance between the chips 92 and 93, and improve signal transmission efficiency.

The present embodiment configured in this way can implement a configuration in which a plurality of semiconductor chips 92 and 93 are stacked one above the other. There are high frequency devices that require a plurality of semiconductor chips. In this case, as in the case of the present embodiment, it is possible to reduce signal losses or the like and improve performance of the semiconductor device 91 by vertically laminating the respective semiconductor chips. Furthermore, by combining the electromagnetic shield structure shown in the second embodiment with the laminated semiconductor chip, it is possible to suppress interference between the respective semiconductor chips and implement a semiconductor device with high reliability.

Transistors used for a high frequency circuit require a matching circuit, and so a matching circuit is often connected to a semiconductor chip. In this case, in the present embodiment, if, for example, the semiconductor chip 93 is a matching circuit, the semiconductor chip and the matching circuit can be formed by vertically laminating one above the other. This makes it possible to reduce the mounting area of the semiconductor device 91 and promote a cost reduction.

Tenth Embodiment

Figure 29:
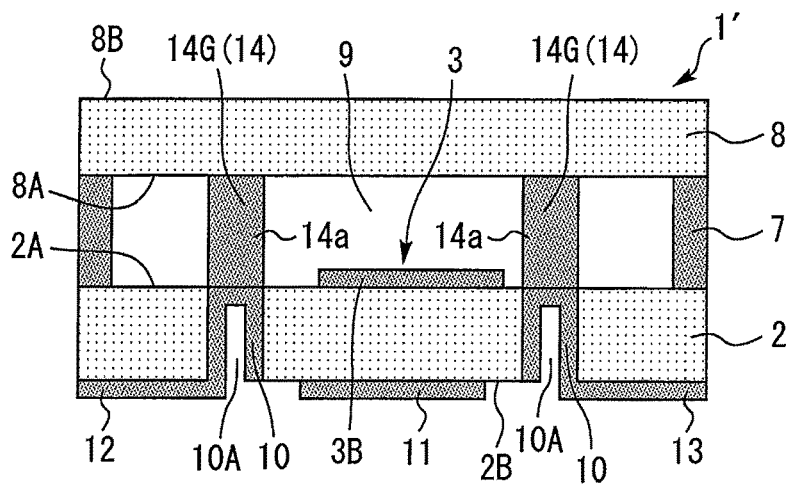
FIG. 29 is a cross-sectional view of a semiconductor device according to the tenth embodiment of the present invention seen from a position similar to that in FIG. 2.

Next, a tenth embodiment of the present invention will be described with reference to FIG. 29. A feature of the present embodiment is a configuration in which the bump portion does not include the electrode pad nor the bonding pad. FIG. 29 is a cross-sectional view of a semiconductor device according to the tenth embodiment of the present invention seen from a position similar to that in FIG. 2. As shown in this drawing, a bump portion 14G of a semiconductor device 1' is constructed of only a bump body 14a. Therefore, one end side of the bump body 14a is directly bonded to the via portion 10. The other end side of the bump body 14a is directly bonded to the surface 8A of the cap substrate 8. The present embodiment configured in this way can also obtain effects similar to those of the first embodiment.

Configuration of Via Portion of First to Ninth Embodiments

Figure 30:
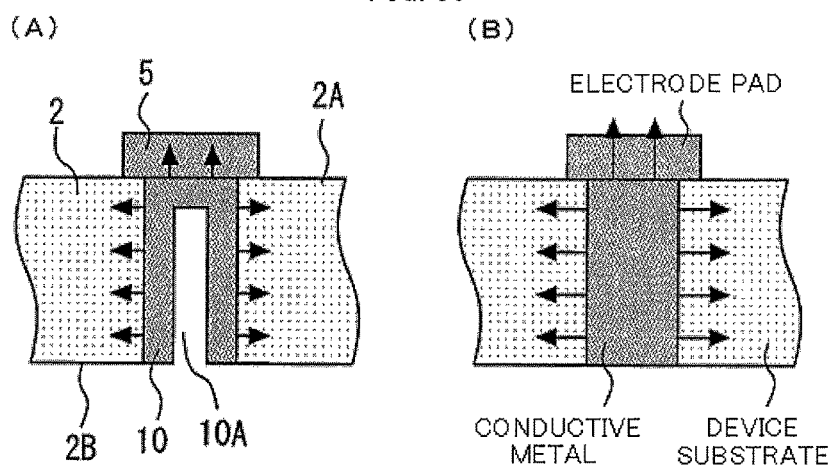
FIG. 30 is an explanatory diagram illustrating a cross-sectional view 30(A) of the via portion according to the first to ninth embodiments of the present invention in comparison with a cross-sectional view 30(B) of the via portion according to a prior art.

Next, a configuration of the via portion according to the first to ninth embodiments will be described with reference to FIG. 30. FIG. 30 is an explanatory diagram illustrating a cross-sectional view 30(A) of the via portion according to the first to ninth embodiments of the present invention in comparison with a cross-sectional view 30(B) of the via portion according to a prior art. As shown in FIG. 30(A), the via portion 10 is configured by forming a via hole in the device substrate 2 and conformally forming a conductive layer in this via hole.

"Conformal" here means forming a conductive layer on a side wall (plated surface) of the via hole to a uniform thickness without completely filling the via hole with the conductive layer. However, a degree of variation in thickness that does not affect transmission of a signal by the via portion 10 does not matter. More specifically, the conductive layer is preferably formed using means such as plating to a thickness about 1 to 3 micrometer. The conductive layer of the via portion 10 formed in this way includes, for example, a cavity 10A which is opened on the back surface 2B side of the device substrate 2. The via portion 75 formed in the cap substrate 8 is also formed similarly to the via portion 10 and includes a cavity which is opened on the back surface 8B side of the cap substrate 8.

Next, effects when the conductive layer is formed conformally will be described. First, according to the prior arts shown in PTLs 1 to 3, for example, the via hole is filled with the conductive metal constituting the via portion as shown in FIG. 30(B). In this case, when a heat history is added, stress occurs on peripheral substrates as the conductive metal of the via portion expands or contracts. Note that in FIG. 30, the magnitude of stress is represented by the size of arrows. According to the prior art, since no cavity exists in the via portion, stress caused by thermal deformation of the conductive metal is added to the peripheral substrates as it is, which causes the stress on the substrate side to increase.

In contrast, the via portion 10 according to the first to ninth embodiments allows, for example, the thermally expanded conductive layer to escape to the cavity 10A. This makes it possible to reduce stress added to substrates such as the device substrate 2 and the cap substrate 8 and suppress cracking in the substrates 2 and 8 or peeling of the electrode pads 4, 5 and 6 or the like. As a result, it is possible to prevent airtightness breakdown of the hollow part 9 and improve reliability of the semiconductor device compared to the prior art.

Eleventh Embodiment

Figure 31:
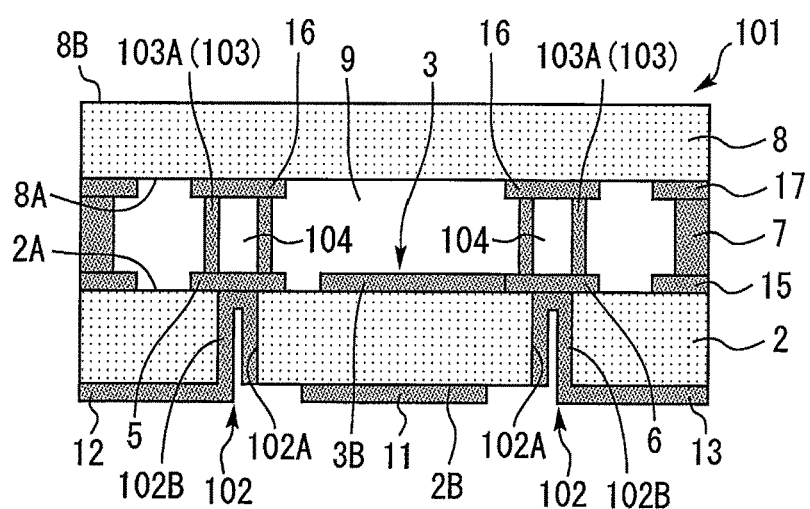
FIG. 31 is a cross-sectional view of the semiconductor device according to the eleventh embodiment of the present invention seen from a position similar to that in FIG. 2.
Figure 32:
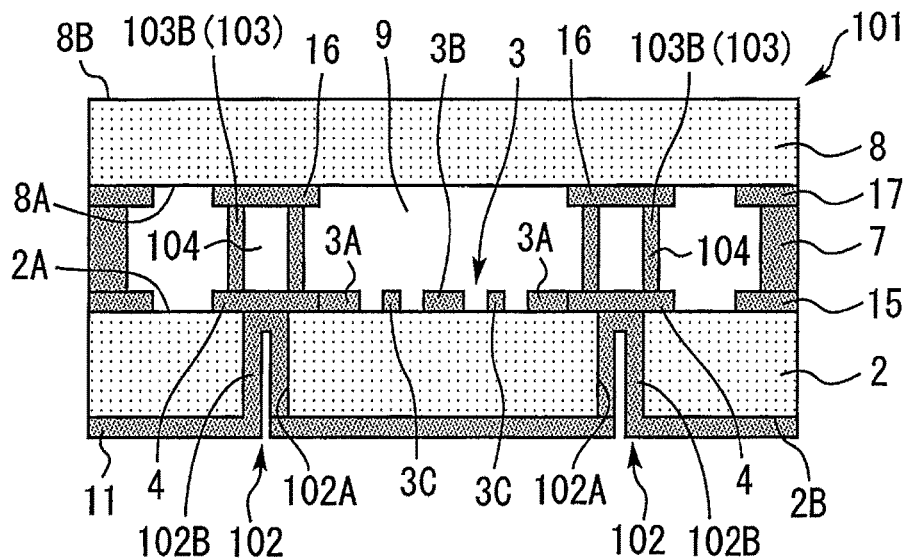
FIG. 32 is a cross-sectional view of the semiconductor device according to the eleventh embodiment of the present invention seen from a position similar to that in FIG. 3.
Figure 33:
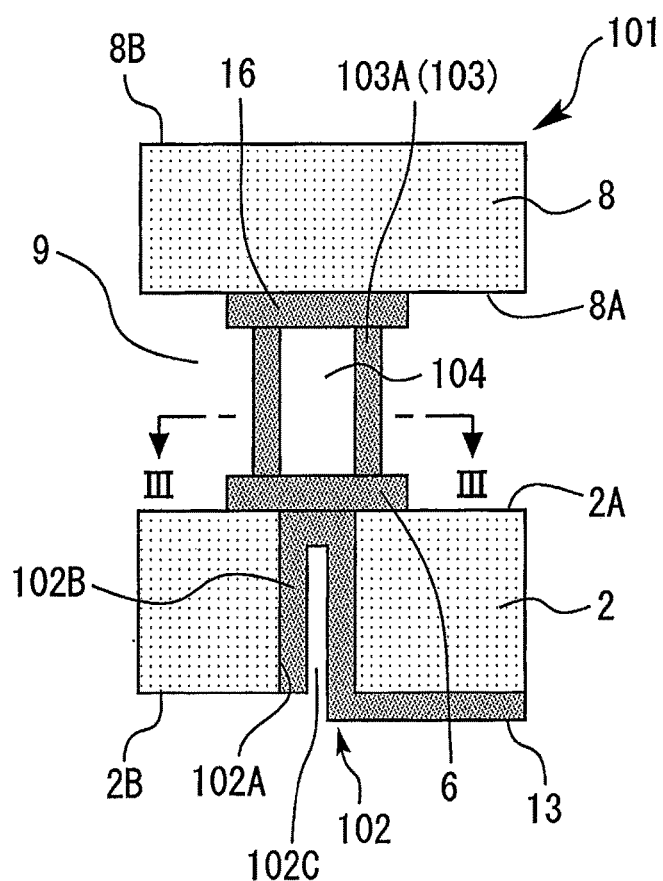
FIG. 33 is an enlarged cross-sectional view of main parts of the bump portion or the like in FIG. 31.
Figure 34:
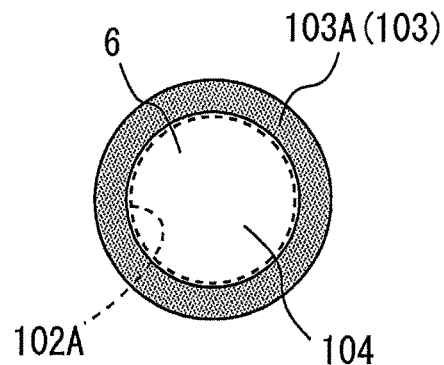
FIG. 34 is a cross-sectional view along an arrowed line III-III in FIG. 33 showing a lateral cross-sectional view of the bump portion.

Next, an eleventh embodiment of the present invention will be described with reference to FIG. 31 to FIG. 42. According to the present embodiment, the bump portion has a hollow structure. FIG. 31 and FIG. 32 are cross-sectional views of the semiconductor device according to the eleventh embodiment of the present invention seen from a position similar to those in FIG. 2 and FIG. 3. FIG. 33 is an enlarged cross-sectional view of main parts of the bump portion or the like in FIG. 31. FIG. 34 is a cross-sectional view along an arrowed line III-III in FIG. 33 showing a lateral cross-sectional view of the bump portion. As shown in these drawings, the semiconductor device 101 is provided with the substrates 2 and 8, the semiconductor circuit 3, the electrode pads 4, 5 and 6, a via portion 102 and a bump portion 103 or the like as in the case of the first embodiment.

The device substrate 2 and the cap substrate 8 abut against each other via the sealing frame 7 with the front surfaces 2A and 8A facing each other. A hollow part 9 surrounded by the sealing frame 7 is formed between the respective front surfaces 2A and 8A. The semiconductor circuit 3 is housed in the hollow part 9 in an airtight state. The ground electrode pad 4, the input electrode pad 5 and the output electrode pad 6 to be connected to the semiconductor circuit 3 are formed on the front surface 2A of the device substrate 2. Furthermore, a bonding pad 16 as an electrode pad similar to that of the first embodiment is formed on the surface 8A of the cap substrate 8.

The via portion 102 is constructed of a via hole 102A and a filler metal 102B. The via hole 102A is formed as a cylindrical through hole and penetrates the device substrate 2 between the front surface 2A and the back surface 2B. The via hole 102A is opened on the back surface side of the electrode pads 4, 5 and 6 and has a circular opening end. The filler metal 102B fills the inside of the via hole 102A, is connected (bonded) to the electrode pads 4, 5 and 6, and extends towards the back surface 2B of the device substrate 2. A cavity 102C similar to that in the first embodiment is formed in the filler metal 102B as shown in FIG. 33.

The bump portion 103 is intended to connect any one of the electrode pads 4, 5 and 6 of the device substrate 2 to the bonding pad 16 of the cap substrate 8 in a one-to-one correspondence. The bump portion 103 is formed of, for example, Au, Ag, Cu, Pt, Pd or an alloy of those metals as a cylindrical hollow structure. Use of such a material can increase thermal conductivity of the bump portion 103 and improve heat dissipation performance of the semiconductor device 101. Therefore, it is possible to suppress an operating temperature of the semiconductor device 101 low and stabilize the operation.

A columnar cavity 104 is formed in the bump portion 103. One end of the cavity 104 in an axial direction faces the surface of one of the electrode pads 4, 5 and 6 and the other end faces the surface of the bonding pad 16. Note that in the present embodiment as in the case of the first embodiment, one of the bump portions 103 which is connected to the input electrode pad 5 or output electrode pad 6 and not grounded via the ground electrode pad 4 and the via portion 102 is denoted as a "bump portion 103A." On the other hand, a bump portion which is grounded via the ground electrode pad 4 and the via portion 102 is denoted as a "bump portion 103B."

The bump portion 103 is disposed outside an opening end of the via hole 102A over an entire circumference of the via hole 102A which is opened on the back surface side of the electrode pads 4, 5 and 6 connected to the bump portion 103. More specifically, according to the present embodiment, the inner diameter of the bump portion 103 is formed to be larger than the diameter of the via hole 102A as shown in FIG. 34. That is, the bump portion 103 is disposed on the outer circumferential side than the via hole 102A in a plan view seen from the axial direction and concentrically disposed at a position surrounding the entire circumference of the via hole 102A from the outer circumferential side.

Figure 35:
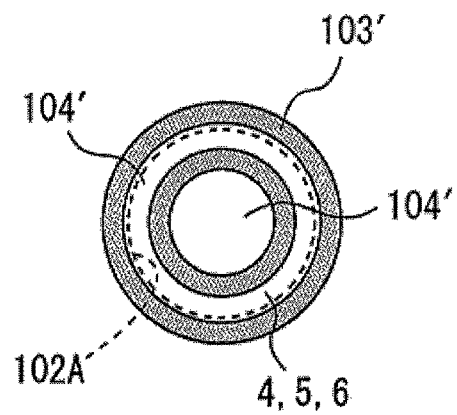
FIG. 35 is a lateral cross-sectional view of a bump portion illustrating a modification of the eleventh embodiment of the present invention.

Note that FIG. 34 has illustrated a case where the cavity 104 is formed into a columnar shape, but the present invention is not limited to this, and a non-columnar cavity may also be formed in the bump portion 103. As an example, FIG. 35 is a lateral cross-sectional view of a bump portion illustrating a modification of the eleventh embodiment of the present invention. A bump portion 103' shown in this drawing is formed into a double cylindrical shape and two concentrically arranged cavities 104' are formed in the bump portion 103'.

Figure 36:
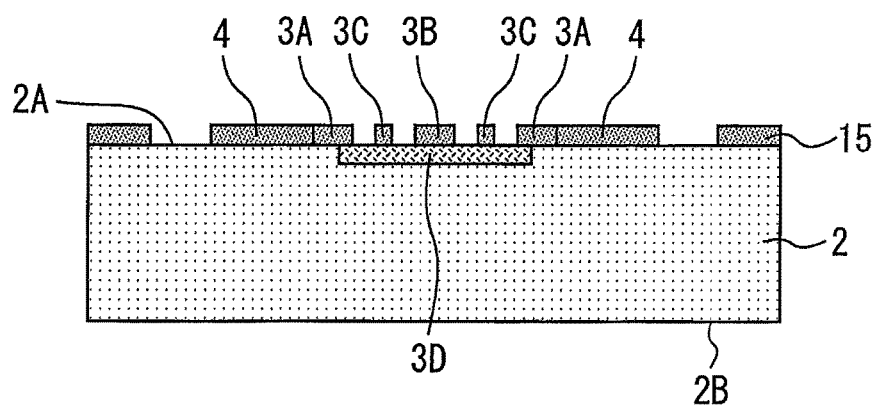
FIG. 36 illustrates a step of patterning the device substrate.

Next, an example of a manufacturing procedure of the semiconductor device 101 having a HEMT transistor structure will be described with reference to FIG. 36 to FIG. 42. These drawings are cross-sectional views seen from a position similar to that in FIG. 3. First, FIG. 36 illustrates a step of patterning the device substrate. In this step, a semiconductor operation layer (active layer) 3D containing carriers is formed using means such as epitaxial growth, ion implantation on a surface of a substrate created from a substrate wafer of Si, SiGe, SiC, InP or GaAs or the like first. In the next process, the semiconductor circuit 3 including a transistor structure is formed using means such as photolithography, etching, and metal film formation. In the HEMT structure made up of three types of electrodes: the source electrode 3A, the drain electrode 3B and the gate electrode 3C, are formed on the semiconductor operation layer 3D.

The device substrate 2 including the semiconductor operation layer is formed in this way. Note that in the example shown in the present embodiment, the source electrode 3A is extracted to the back surface 2B side of the device substrate 2 through the via portion 102, and so the ground electrode pad 4 connected to the source electrode 3A is formed on the front surface 2A of the device substrate 2. The ground electrode pad 4 is formed, for example, by consecutively forming the two metal layers. One of the two metal layers is a metal layer containing, for example, Ti, Pt, W or Ni, having high adhesion with the device substrate 2 and with good diffusion barrier performance. The other metal layer is a metal layer containing highly conductive metal such as Au, Ag, Cu, Pd or Pt. In the present step, the bonding pad 15 is also formed of a material similar to that of the ground electrode pad 4.

Figure 37:
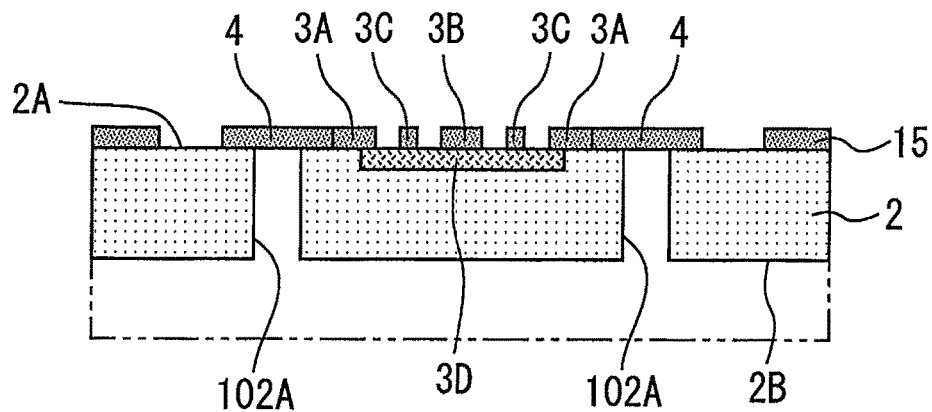
FIG. 37 is a cross-sectional view illustrating a step of thinning the device substrate and forming the via holes.

Next, FIG. 37 is a cross-sectional view illustrating a step of thinning the device substrate and forming the via holes. In this step, the device substrate 2 is thinned to reduce thermal resistance, inductance or the like of the device substrate 2. The thickness of the device substrate 2 is preferably about several tens of micrometer to several hundreds of micrometer. Next, the via holes 102A for extracting the electrode pads 4, 5 and 6 to the back surface 2B side of the device substrate 2 are respectively formed at predetermined positions of the device substrate 2. The via holes 102A are formed from the back surface 2B of the device substrate 2 by applying wet etching, dry etching or the like. Since the ground electrode pad 4 functions as an etching stopper when the via holes 102A are formed, the thickness of the ground electrode pad 4 is determined according to an etching speed of the electrodes or the like under via processing conditions.

Figure 38:
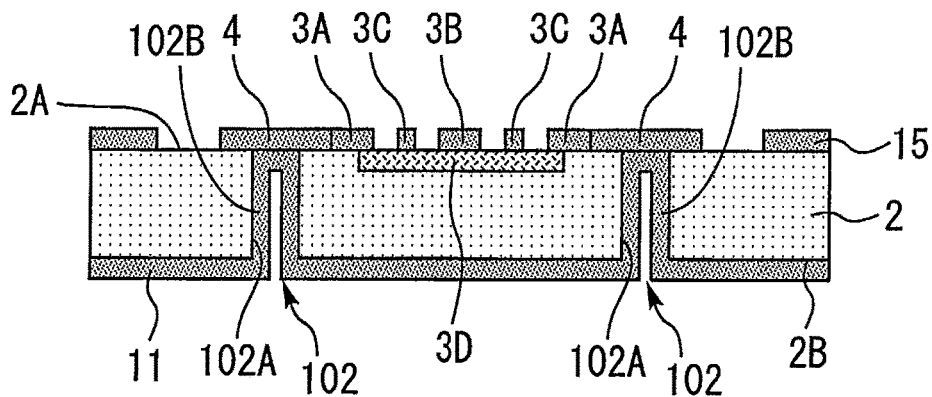
FIG. 38 is a cross-sectional view illustrating a step of forming the via portions and the ground electrodes in the device substrate.

Next, FIG. 38 is a cross-sectional view illustrating a step of forming the via portions and the ground electrodes in the device substrate. In this step, after forming a seed layer using means such as sputtering, electroless plating or the like, resist patterning is performed, the ground electrode 11 and the filler metal 102B are formed through electroless plating and the via portions 102 are completed. At this time, the seed layer is preferably formed by forming two metal layers consecutively as in the case of the ground electrode pad 4. In electroless plating, a conductive layer of Au, Ag, Cu, Pd, Pt or the like is formed to a thickness of about 1 to 5 micrometer, for example. Electroless plating is used because the conductive layer can be easily thickly plated to the inside of the via hole 102A compared to the film formed through sputtering or the like. Note that the seed layer formed outside the electrodes is removed using wet etching or dry etching after removing the resist.

Figure 42:
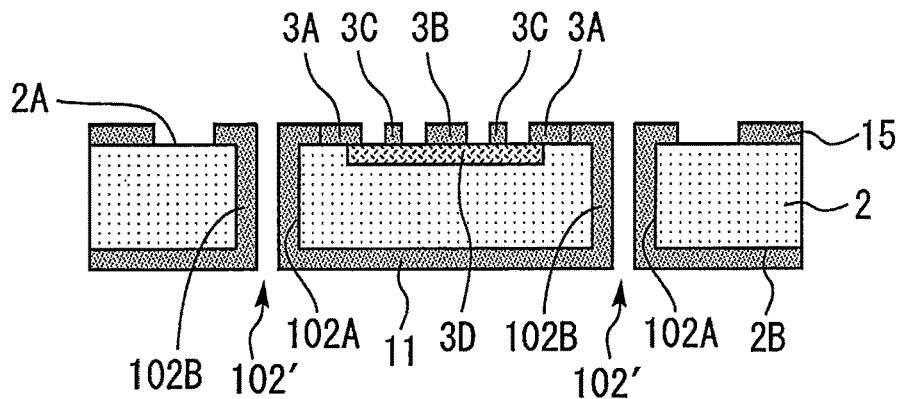
FIG. 42 is a cross-sectional view illustrating another modification of the eleventh embodiment of the present invention.

Note that the present embodiment may also adopt a configuration as in the case of another modification shown FIG. 42, for example, in which via portions 102' extending to the front surface 2A of the device substrate 2 are formed without forming the ground electrode pad 4. In this case, the via holes 102A are formed first and then a resist is patterned to both the front surface 2A and the back surface 2B of the device substrate 2. Then, the electrode pads 5 and 6, and the ground electrode 11 are formed and the configuration shown in FIG. 42 can be thereby obtained.

Figure 39:
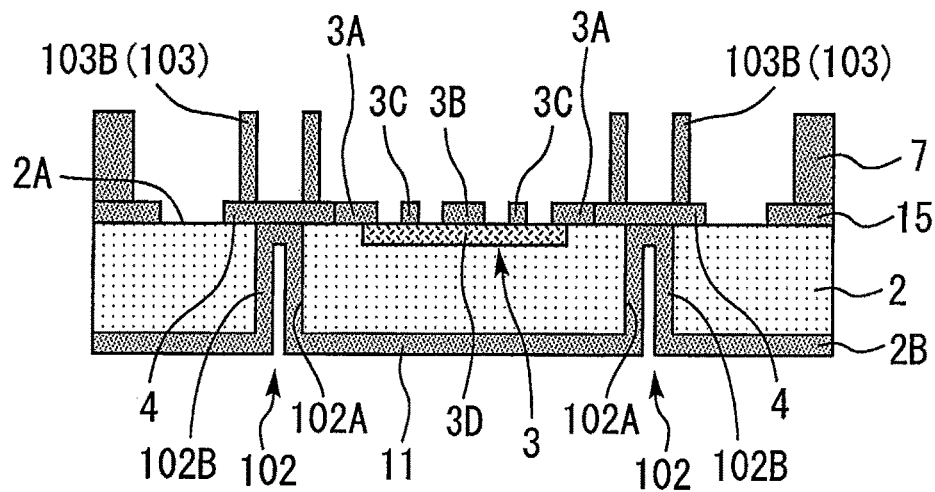
FIG. 39 illustrates a step of forming the bump portions and the sealing frame.

Next, FIG. 39 illustrates a step of forming the bump portions and the sealing frame. In this step, the bump portions 103 are formed on the electrode pads 4, 5 and 6, and the sealing frame 7 is formed on the bonding pad 15. Since the bump portions 103 play the role of reinforcing the electrode pads 4, 5 and 6, the bump portions 103 are preferably formed of a rigid material. Thus, a metal, inorganic insulating film such as silicon oxide film or organic film of polyimide or the like is used as the material of the bump portions 103. Note that the bump portions 103 need always be formed on all the via portions 102 but it does not matter that the bump portions 103 are also formed in parts where no via portion 102 exists.

The sealing frame 7 may be formed in a separate step, but if the bump portions 103 and the sealing frame 7 are formed simultaneously, for example, the bump portion 103 and the sealing frame 7 can be aligned to the same height and the cap substrate 8 can be bonded easily in the next step. The height of the bump portion 103 needs to be greater than that of the structure on the HEMT transistor surface (electrodes 3A, 3B and 3C or the like) and is preferably set to about 3 micrometer to 20 micrometer, for example. When the bump portions 103 and the sealing frame 7 are metals, a plating method suitable for thick film formation, for example, may be used as the method of forming these regions. When using the plating method, patterning is performed using a photoresist and the bump portion 103 and the sealing frame 7 are formed through electric plating or electroless plating. Note that when performing electric plating, a seed layer needs to be formed before patterning the photoresist.

Here, since the bump portion 103 has a structure including the cavity 104 in the center, if patterning is performed using a photoresist, its cross-sectional shape on the cross section parallel to the front surface 2A of the device substrate 2 has a certain shape like a ring shape (circular shape) or the like. The bump portion 103 is formed to be outside the outer diameter of the via hole 102A and with a width greater than that so as to remain unaffected by deformation or the like that may occur in the via portion 102. Note that the material of the sealing frame 7 is preferably an inorganic insulating film capable of increasing air tightness such as metal, silicon oxide film. An organic material such as polyimide is inferior in air tightness to an inorganic insulating film. However, when the sealing frame 7 is bonded to the cap substrate 2, use of an organic material allows bonding to be performed in a simple process. Therefore, it is preferable to select a material of the sealing frame 7 in accordance with the level of air tightness required for the semiconductor device 101.

Figure 40:
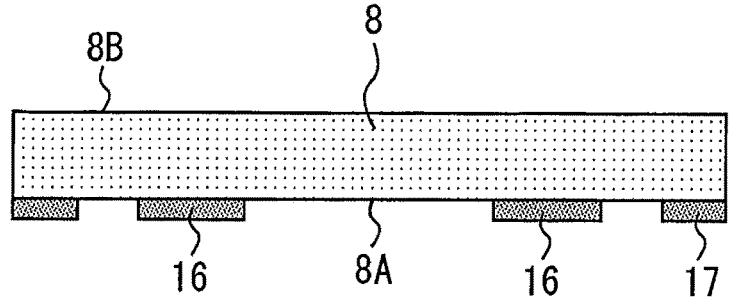
FIG. 40 illustrates a step of forming the bonding pad on the cap substrate.

Next, FIG. 40 illustrates a step of forming the bonding pad on the cap substrate. In this step, the bonding pads 16 and 17 to receive the bump portion 103 and the sealing frame 7 are formed on the surface 8A of the cap substrate 8. The bonding pads 16 and 17 are patterned by etching or the like for insulating between the bump portions 103.

Figure 41:
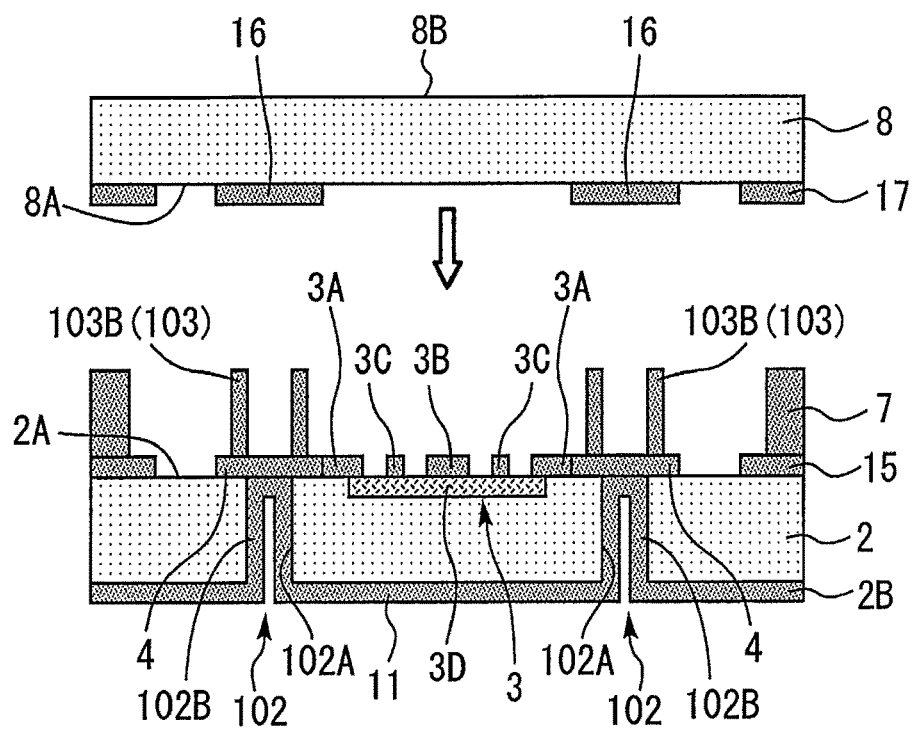
FIG. 41 is a cross-sectional view illustrating a step of bonding together the device substrate and the cap substrate.

Next, FIG. 41 is a cross-sectional view illustrating a step of bonding together the device substrate and the cap substrate. As an example of this step, if, for example, the bump portion 103 and the sealing frame 7 are formed of a metal with a low melting point such as Sn or SnAg solder, the bonding pads 16 and 17 are press-bonded with the bump portion 103 and the sealing frame 7 heated to a temperature equal to or higher than 200· C which exceeds the melting point. Another bonding method is a method whereby bonding surfaces which are bonded together are formed of the same metal such as Au and ultrasound is added thereto to bond both surfaces. Furthermore, after activating the bonding surfaces by plasma under high vacuum environment, both surfaces may be bonded under a high pressure. Furthermore, a nano-paste is formed by mixing fine metal particles of Au, Ag, Cu, Pd, Pt or the like with a solvent, the nano-paste is patterned to form the bump portion 103 and the sealing frame 7, and these may be press-bonded to the bonding pads 16 and 17 under a high temperature.

The higher level the parameters such as load, ultrasound, and temperature demonstrate at the time of bonding, the better the bonding state becomes, no matter which of the aforementioned bonding methods is used. The smaller the pattern area of the bump portion 103 and the sealing frame 7, the more efficiently ultrasound, load or the like acts on these regions. However, when the pattern is excessively fine, problems such as deterioration of sealability, insufficient strength are more likely to occur, and so the pattern area is determined based on a minimum size to avoid such problems. For example, the thickness in the diameter direction of the cylindrical bump portion 103 and the width of the sealing frame 7 are preferably set to 5 micrometer to 20 micrometer, respectively.

A high-flatness substrate such as a semiconductor substrate, glass, sapphire substrate is preferably used as a material of the cap substrate 8. This is because the higher the flatness of the substrate, the more uniform the bonding state becomes, and stable airtight sealing is obtained. Furthermore, the device substrate 2 and the cap substrate 8 are preferably formed of the same material or materials having similar linear thermal expansion coefficients. This makes it possible to suppress stress caused by a heat history. Note that when a material such as epoxy resin, an organic film of polyimide is used, air tightness tends to lower.

Note that in the aforementioned manufacturing procedure of the semiconductor device 101, the step of thinning the device substrate 2 and forming the via hole 102A (FIG. 37), and the step of forming the via portion 102 and the ground electrode 11 on the device substrate 2 (FIG. 38) may be executed after the step of forming the bump portion 103 and the sealing frame 7 (FIG. 39) and the step of forming the bonding pads 16 and 17 on the cap substrate 8 (FIG. 40).

Since the description of the above-described manufacturing procedure is based on the cross-sectional view in FIG. 32, the state has been illustrated in which the ground electrode pad 4 is connected on the front surface side of the via portion 102 and the ground electrode 11 is connected on the back surface side of the via portion 102. However, the present invention is not limited to this. For example, in FIG. 31, the input electrode pad 5 and the output electrode pad 6 connected on the front surface side of the via portion 102, and the input electrode 12 and the output electrode 13 connected on the back surface side of the via portion 102 may be also formed using procedures similar to those of the ground electrode pad 4 and the ground electrode 11, respectively, for example.

Furthermore, the configuration in which electrodes formed on the surface side of the substrate are extracted to the back surface side via the via portion can also be implemented for devices other than HEMT using a method similar to that of the present embodiment. A case has been illustrated in the eleventh embodiment where the via portion 102 exists only on the device substrate 2 side. However, the present invention is not limited to this, but the present invention is also applicable to a configuration in which the via portion 102 exists only on the cap substrate 8 side and a configuration in which the via portions 102 exist on both substrates 2 and 8.

The present embodiment configured in this way can also obtain effects similar to those of the first embodiment. Moreover, since the bump portion 103 is configured to include the cavity 104 in the present embodiment, it is possible to obtain the following effects compared to a solid bump portion with no cavity. Here, a problem with the solid bump portion will be described. When a solid bump portion is formed for each via portion, the amount of metal or the like used for forming the bump portion increases considerably, resulting in a problem of causing a cost increase. Furthermore, when the bump portion and the sealing frame are bonded to a substrate at the other end, the greater the number of bump portions, the higher load is required. However, since there is a trend toward larger wafer diameters in recent years, if the number of solid bump portions increases, there is a problem that bonding failures are likely to occur due to an insufficient load capacity of a bonding apparatus.

In contrast, according to the present embodiment, since the bump portion 103 has a hollow structure, it is possible to reduce the amount of materials used for the bump portion 103 while keeping the effects described in the first embodiment. It is thereby possible to reduce the cost of the semiconductor device 101 and stably seal the hollow part 9 at low cost. Furthermore, the bump portion 103 is disposed outside the opening end of the circular via hole 102A on the entire circumference of the via hole 102A. That is, according to the present embodiment, the inner diameter of the bump portion 103 is formed to be greater than the outer diameter of the via hole 102A. The contact surface on which the bump portion 103 is in contact with the electrode pads 4, 5 and 6 is configured to be located outside the opening end on the entire circumference of the opening end of the via hole 102A.

This allows the bump portion 103 to press the electrode pads 4, 5 and 6 outside the filler metal 102B in the via hole 102A. Therefore, it is possible to prevent electrode pads 4, 5 and 6 from being peeled off the device substrate 2 due to deformation or the like. When the substrates 2 and 8 are bonded, the bump portion 103 is compressed and made into a bulk, and so a strong force is applied to the electrode pads 4, 5 and 6 and the filler metal 102B, and breakage, peeling or the like is likely to occur in these regions. Particularly, the top surface part (joint with the electrode pad 4, 5 or 6) of the filler metal 102B is a thin metal layer and has low strength, and so when a force is added from the bump portion 103 at the time of bonding, deformation breakdown, appearance defect, bonding abnormality, airtightness abnormality or the like may occur. However, according to the present embodiment, when a force is added to the electrode pads 4, 5 and 6 from the bump portion 103, this force is received by the device substrate 2 outside the via hole 102A. Therefore, it is possible to reduce the force added to the electrode pads 4, 5 and 6 and the filler metal 102B and suppress breakage, peeling or the like.

Furthermore, since the bump portion 103 is formed into a cylindrical shape, it is possible to reduce the contact area between the bump portion 103 and the bonding pads 16 and 17 on the cap substrate 8 side. Thus, when the substrates 2 and 8 are bonded together, even the same load can cause the force added to the joint to increase. Therefore, when a maximum load of the bonding apparatus is limited, it is possible to add the maximum load to the joint between the substrates 2 and 8, stably bond the substrates 2 and 8, and suppress bonding defects. Furthermore, since the center of the bump portion 103 becomes the cavity 104, it is possible to improve followability of the bump portion 103 against deformation or distortion of the substrates 2 and 8 caused by a heat history or the like in process and mounting steps.

According to the present embodiment, the bump portion 103 is formed such that the shape of the bump portion 103 projected onto a plane perpendicular to the front surfaces 2A and 8A of the substrates 2 and 8 becomes rectangular. In the step of bonding the substrates 2 and 8, this makes it possible to uniformly pressurize the whole bump portion 103 and vertically add a force to the substrates 2 and 8. Therefore, it is possible to efficiently add a force to the substrates 2 and 8 and increase air tightness of the hollow part 9 without allowing the force when being bonded to escape.

Twelfth Embodiment

Figure 43:
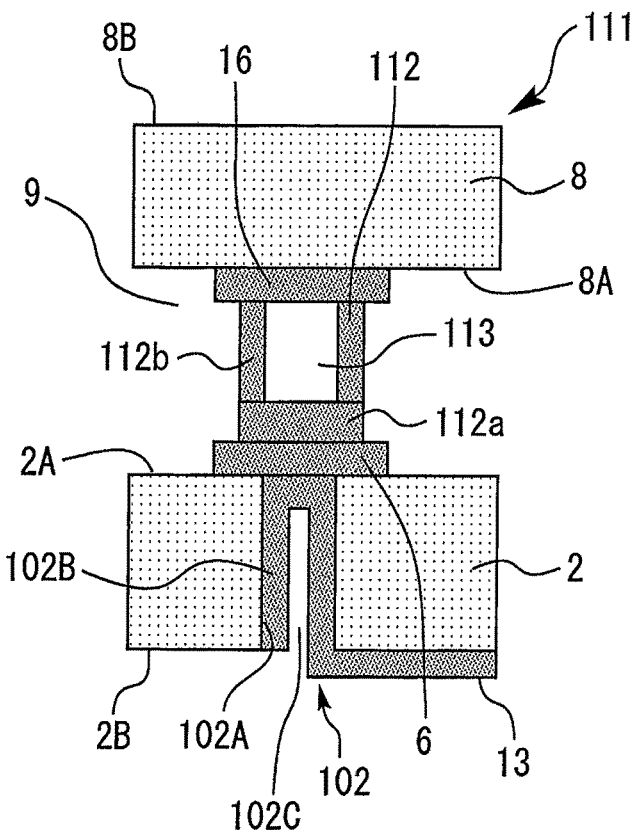
FIG. 43 is an enlarged cross-sectional view of main parts showing an enlarged view of the bump portion or the like of a semiconductor device according to the twelfth embodiment of the present invention.
Figure 44:
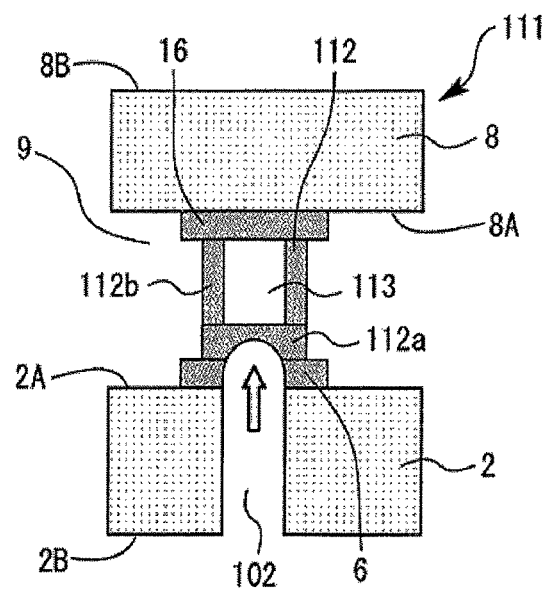
FIG. 44 is an enlarged cross-sectional view of main parts illustrating a situation in which overetching occurs when a via hole is formed, seen from a position similar to that in FIG. 43.

Next, a twelfth embodiment of the present invention will be described with reference to FIG. 43 and FIG. 44. The present embodiment assumes that only part of the bump portion has a hollow structure. FIG. 43 is an enlarged cross-sectional view of main parts showing an enlarged view of the bump portion or the like of a semiconductor device according to the twelfth embodiment of the present invention. Furthermore, FIG. 44 is an enlarged cross-sectional view of main parts illustrating a situation in which overetching occurs when a via hole is formed, seen from a position similar to that in FIG. 43. The semiconductor device 111 is provided with the substrates 2 and 8, the semiconductor circuit 3, the electrode pads 4, 5 and 6, the via portion 102 and the bump portion 112 or the like similarly to those in the eleventh embodiment.

The bump portion 112 is constructed of a first bump layer 112a and a second bump layer 112b, and has a double-layer structure. The first bump layer 112a is formed as a columnar solid structure with no cavity inside. Furthermore, the bump layer 112a is bonded to the output electrode pad 6 and separated from the bonding pad 16 of the cap substrate 8. On the other hand, the second bump layer 112b is formed as a cylindrical hollow structure including a cavity 113 therein. Furthermore, the bump layer 112b is laminated with the first bump layer 112a in a direction perpendicular to the front surfaces 2A and 8A of the substrates 2 and 8, and bonded to the bump layer 112a and the bonding pad 16.

As an example of the method of forming the bump portion 112, the bump layer 112a may be patterned on the device substrate 2 side, for example, the bump layer 112b may be patterned on the cap substrate 8 side and then the bump layers 112a and 112b may be bonded together. Patterning may be performed twice on any one of the substrates 2 and 8, and the bump layer 112a and the bump layer 112b may be laminated together and the laminated body may be then bonded to the other substrate. In consideration of a misalignment between the bump layers 112a and 112b, the cross-sectional area of the bump layer 112b may be formed to be smaller than that of the bump layer 112a.

According to the present embodiment configured in this way, it is possible to obtain the following effects in addition to the effects similar to those in the eleventh embodiment. First, FIG. 44 is an enlarged cross-sectional view of main parts illustrating a situation in which overetching occurs when a via hole is formed, seen from a position similar to that in FIG. 43. When dry etching is used as the etching method for the via hole 102A, as shown in FIG. 44, etching advances also with respect to the output electrode pad 6, and overetching may cause the via hole to penetrate the output electrode pad 6 depending on the condition. Thus, as a normal countermeasure, a method whereby the output electrode pad 6 is thickened may be considered. However, this method results in a problem that the electrodes 3A, 3B and 3C of the semiconductor circuit 3 and the other electrode pads 4 and 5, and the bonding pad 15 or the like also need to be thickened, thus leading to a cost increase.

In contrast, according to the present embodiment, the bump layer 112b can receive the overetching even when the output electrode pad 6 is thinned. Therefore, it is possible to make the output electrode pad 6 thinner and promote a cost reduction while preventing the via hole 102A from communicating with the hollow part 9 due to overetching. Moreover, the bump portion 112 can exert effects similar to those of the eleventh embodiment through the partial cavity 113.

Note that a case has been illustrated in the present embodiment where the bump portion 112 is bonded to the output electrode pad 6. However, the present invention is not limited to this, and the bump portion 112 is also applicable to the bump portion bonded to the other electrode pads 4 and 5.

1,1',21,31,41,51,61,71,81,91,101,111 semiconductor device
2 device substrate (substrate)
2A,8A,94A front surface (opposite surface)
2B,8B,94B back surface
3 semiconductor circuit
3A source electrode
3B drain electrode
3C gate electrode
3D semiconductor operation layer
4 ground electrode pad (electrode pad)
5 input electrode pad (electrode pad)
6 output electrode pad (electrode pad)
7 sealing frame
8 cap substrate (substrate)
9 hollow part
10,75,102,102' via portion
10A,102C,104,104',113 cavity
11,72,95 ground electrode
12,73,96 input electrode
13,74,97 output electrode
14,14A,14B,14C,14D,14E,14F,14G,103,103',103A,103B, 112 bump portion
14a,14a' bump body
15,17 bonding pad
16 bonding pad (electrode pad)
18,19 wafer
20 mark
22,32,42,52,62,82 conductive film
23 insulating gap
33,43,63 insulating film
76 base member
77 matching substrate
78 wire bonding
92,93 semiconductor chip
94 common substrate
102A via hole
102B filler metal
112a first bump layer
112b second bump layer

The invention claimed is:
1. A semiconductor device comprising:
a device substrate having a front surface and a back surface;
a semiconductor circuit provided on the front surface of the device substrate;
a sealing frame bonded to the front surface of the device substrate and surrounding the semiconductor circuit;
a cap substrate having a front surface and a back surface, wherein the front surface of the cap substrate is bonded to the whole perimeter of the sealing frame while covering the semiconductor circuit to form a hollow part provided between the device substrate and the cap substrate and housing the semiconductor circuit in an airtight state;
a plurality of via portions formed of a conductive material for connecting the semiconductor circuit to outside parts, the plurality of via portions penetrating the device substrate, and the plurality of via portions connected to the semiconductor circuit; and
a plurality of bump portions respectively provided at positions of the via portions in the hollow part and connecting the via portions to the cap substrate, wherein
at least one of the plurality of bump portions is not grounded via any of the plurality of via portions, and
at least another of the plurality of bump portions is grounded via at least one of the plurality of via portions.

2. The semiconductor device according to claim 1, wherein at least a part of the bump portions is formed of a conductive material, and
a conductive film is provided on the front surface of the cap substrate and covers the front surface of the cap substrate while being insulated from some of the part of the bump portions not grounded via the via portions.

3. The semiconductor device according to claim 1, wherein at least a part of the bump portions is formed of a conductive material,
the part of the bump portions not grounded via the via portions includes an insulating material, and
a conductive film is provided on the front surface of the cap substrate and covers the entire front surface of the cap substrate.

4. The semiconductor device according to claim 1, wherein the plurality of via portions are a plurality of first via portions, and the plurality of bump portions are first bump portions, the semiconductor device comprising:
a plurality of second via portions formed of a conductive material for connecting the semiconductor circuit to outside parts, the plurality of second via portions penetrating the cap substrate, and the plurality of second via portions connected to the semiconductor circuit; and
second bump portions located in the hollow part with the first bump portions, the second bump portions provided at positions of the second via portions of the cap substrate, and the second bump portions connecting the second via portions to the device substrate.

5. The semiconductor device according to claim 4, wherein at least the second bump portions are formed of a conductive material, and
a conductive film is provided on the front surface of the cap substrate and covers the front surface while being insulated from the second bump portions.

6. The semiconductor device according to claim 4, comprising a single conductive film formed on the back surface of the device substrate and connected to the semiconductor circuit via the first via portions formed in the device substrate.

7. A semiconductor device comprising:
a device substrate having a front surface and a back surface;
a semiconductor circuit provided on the front surface of the device substrate;
a sealing frame bonded to the front surface of the device substrate and surrounding the semiconductor circuit;
a cap substrate having a front surface and a back surface, wherein the front surface of the cap substrate is bonded to the sealing frame while covering the semiconductor circuit to form a hollow part provided between the device substrate and the cap substrate and housing the semiconductor circuit in an airtight state;
a plurality of first via portions formed of a conductive material for connecting the semiconductor circuit to outside parts, the plurality of first via portions penetrating the device substrate, and the plurality of first via portions connected to the semiconductor circuit;
a plurality of first bump portions respectively provided at positions of the first via portions in the hollow part and connecting the first via portions to the cap substrate;
a plurality of second via portions formed of a conductive material for connecting the semiconductor circuit to outside parts, the plurality of second via portions penetrating the cap substrate, and the plurality of second via portions connected to the semiconductor circuit;
second bump portions located in the hollow part with the first bump portions, the second bump portions provided at positions of the second via portions of the cap substrate, and the second bump portions connecting the second via portions to the device substrate; and
an input electrode, an output electrode, and a ground electrode which are connected to the semiconductor circuit,
wherein at least the second bump portions of the bump portions are formed of a conductive material,
the input electrode and the output electrode are formed on the back surface of the cap substrate and connected to the semiconductor circuit via the second via portions of the cap substrate and the second bump portions, and
the ground electrode is formed of a conductive film covering the entire back surface of the device substrate and connected to the semiconductor circuit via the first via portions of the device substrate.

8. The semiconductor device according to claim 1, wherein a conductive layer is conformally formed in at least one of the via portions of the device substrate or in a through hole of the cap substrate, and the conductive layer includes a cavity.

9. The semiconductor device according to claim 1, wherein the sealing frame is formed of a conductive material.

10. The semiconductor device according to claim 1, wherein the bump portions and the sealing frame are formed of Au, Ag, Cu, Pt, Pd or an alloy of those metals.

11. The semiconductor device according to claim 1, wherein the sealing frame and the bump portions are formed of the same material.

12. The semiconductor device according to claim 1, wherein the device substrate and the cap substrate are formed of the same material.

13. The semiconductor device according to claim 1, wherein the sealing frame and the bump portions are formed to the same height, and the device substrate and the cap substrate are formed into a tabular shape where no concave part exists.

14. The semiconductor device according to claim 1, comprising another semiconductor circuit provided on the back surface side of a common substrate provided between the device substrate and the cap substrate.

15. A semiconductor device comprising:
two substrates including opposite surfaces facing to each other and forming a hollow part between the opposite surfaces;
electrode pads formed on the opposite surfaces of the substrates;

a semiconductor circuit housed in the hollow part in an airtight state and connected to at least one of the electrode pads;

a via portion formed in at least one of the substrates, and including a via hole penetrating at least one of the substrates and opened on a back surface side of one of the electrode pads, and a filler metal filling the via hole and connected to the one of the electrode pads; and a bump portion formed as a cylindrical hollow structure including a cavity therein, and bonded to the electrode pad of one of the substrates and the electrode pad of the other of the substrates, wherein the via portion comprises a plurality of via portions, the bump portion comprises a plurality of bump portions, at least one of the plurality of bump portions is not grounded via any of the plurality of via portions, and at least another of the plurality of bump portions is grounded via at least one of the plurality of via portions.

16. The semiconductor device according to claim 15, the bump portion is located outside an opening end of the via hole over an entire circumference of the via hole opened on a back surface side of the electrode pad connected to the bump portion.

17. The semiconductor device according to claim 15, wherein the bump portion includes:

a first bump layer formed as a columnar solid structure with no cavity inside, connected to the electrode pad of one of the substrates, and separated from the electrode pad of the other of the substrates; and a second bump layer formed as a cylindrical hollow structure including a cavity therein, laminated with the first bump layer in a direction perpendicular to the opposite surfaces of the substrates, and bonded to the first bump layer and the electrode pad of the other of the substrates.

18. The semiconductor device according to claim 1, wherein at least one of the bump portions is formed such that a shape of the at least one of the bump portions projected onto a plane perpendicular to the front surfaces of the device and cap substrates is rectangular.

19. The semiconductor device according to claim 15, wherein the bump portion is formed of Au, Ag, Cu, Pt, Pd or an alloy of those metals.

* * * * *